(12) United States Patent
Alsmeier et al.

(10) Patent No.: US 12,243,865 B2
(45) Date of Patent: Mar. 4, 2025

(54) BONDED SEMICONDUCTOR DIE ASSEMBLY CONTAINING THROUGH-STACK VIA STRUCTURES AND METHODS FOR MAKING THE SAME

(71) Applicant: SANDISK TECHNOLOGIES LLC, Addison, TX (US)

(72) Inventors: Johann Alsmeier, San Jose, CA (US); James Kai, Santa Clara, CA (US); Koichi Matsuno, Fremont, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 44 days.

(21) Appl. No.: 18/100,152

(22) Filed: Jan. 23, 2023

(65) Prior Publication Data

US 2023/0163116 A1 May 25, 2023

Related U.S. Application Data

(62) Division of application No. 16/936,047, filed on Jul. 22, 2020, now Pat. No. 11,587,920.

(51) Int. Cl.
*H10B 43/27* (2023.01)
*H01L 25/00* (2006.01)
(Continued)

(52) U.S. Cl.
CPC .......... *H01L 25/18* (2013.01); *H01L 25/0657* (2013.01); *H01L 25/50* (2013.01);
(Continued)

(58) Field of Classification Search
None
See application file for complete search history.

(56) References Cited

U.S. PATENT DOCUMENTS 5,915,167 A   6/1999   Leedy
9,502,471 B1  11/2016  Lu et al.
(Continued)

FOREIGN PATENT DOCUMENTS

CN   111033739 A   4/2020
CN   111684594 A   9/2020
(Continued)

OTHER PUBLICATIONS

Endoh, T. et al., "Novel Ultra High Density Memory with a Stacked-Surrounding Gate Transistor (S-SGT) Structured Cell," IEDM Proc., (2001), 33-36.
(Continued)

*Primary Examiner* — Sarah K Salerno
(74) *Attorney, Agent, or Firm* — THE MARBURY LAW GROUP PLLC

(57) ABSTRACT

A bonded assembly includes a first three-dimensional memory die containing a first alternating stack of first insulating layers and first electrically conductive layers and first memory structures located in the first alternating stack, a second three-dimensional memory die bonded to the first three-dimensional memory die, and containing a second alternating stack of second insulating layers and second electrically conductive layers, and second memory structures located in the second alternating stack. The first electrically conductive layers have different lateral extents along the first horizontal direction that decrease with a respective vertical distance from driver circuit devices, and the second electrically conductive layers have different lateral extents along the first horizontal direction that increase with the respective vertical distance from the driver circuit devices.

19 Claims, 29 Drawing Sheets

(51) Int. Cl.
*H01L 25/065* (2023.01)
*H01L 25/18* (2023.01)
*H10B 43/40* (2023.01)
*H10B 41/27* (2023.01)

(52) U.S. Cl.
CPC .... *H10B 43/40* (2023.02); *H01L 2225/06541* (2013.01); *H10B 41/27* (2023.02); *H10B 43/27* (2023.02)

(56) References Cited

U.S. PATENT DOCUMENTS

| | | |
|---|---|---|
| 9,530,790 B1 | 12/2016 | Lu et al. |
| 9,935,050 B2 | 4/2018 | Dunga et al. |
| 10,354,980 B1 | 7/2019 | Mushiga et al. |
| 10,354,987 B1 | 7/2019 | Mushiga et al. |
| 10,381,362 B1 | 8/2019 | Cui et al. |
| 10,600,781 B1 | 3/2020 | Xiao et al. |
| 10,629,616 B1 | 4/2020 | Kai et al. |
| 10,665,581 B1 | 5/2020 | Zhou et al. |
| 10,714,497 B1 | 7/2020 | Nishida et al. |
| 10,727,216 B1 | 7/2020 | Kai et al. |
| 10,734,400 B1 | 8/2020 | Fukuo et al. |
| 10,950,626 B2 | 3/2021 | Kai et al. |
| 10,957,680 B2 | 3/2021 | Yada et al. |
| 10,957,705 B2 | 3/2021 | Totoki et al. |
| 10,985,169 B2 | 4/2021 | Kai et al. |
| 11,018,153 B2 | 5/2021 | Kai et al. |
| 11,069,703 B2 | 7/2021 | Nishida et al. |
| 11,094,704 B2 | 8/2021 | Zhang et al. |
| 11,335,671 B2 | 5/2022 | Chibvongodze et al. |
| 11,342,244 B2 | 5/2022 | Kim et al. |
| 2017/0294377 A1 | 10/2017 | Dunga et al. |
| 2018/0053768 A1 | 2/2018 | Kim et al. |
| 2020/0098748 A1 | 3/2020 | Xiao et al. |
| 2020/0144242 A1 | 5/2020 | Park |
| 2020/0227397 A1 | 7/2020 | Yada et al. |
| 2022/0028846 A1 | 1/2022 | Alsmeier et al. |
| 2022/0139878 A1* | 5/2022 | Ogawa .................. H01L 25/50 257/213 |

FOREIGN PATENT DOCUMENTS

KR 20190040066 A 4/2019
WO WO2019/143400 A1 7/2019

OTHER PUBLICATIONS

International Patent Application No. PCT/US2021/035298, International Search Report and Written Opinion, issued Oct. 7, 2021, 14 pages.

* cited by examiner

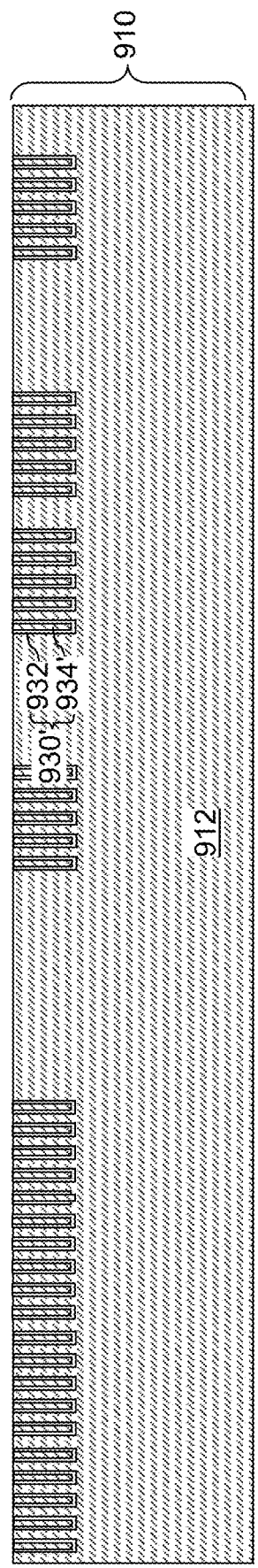
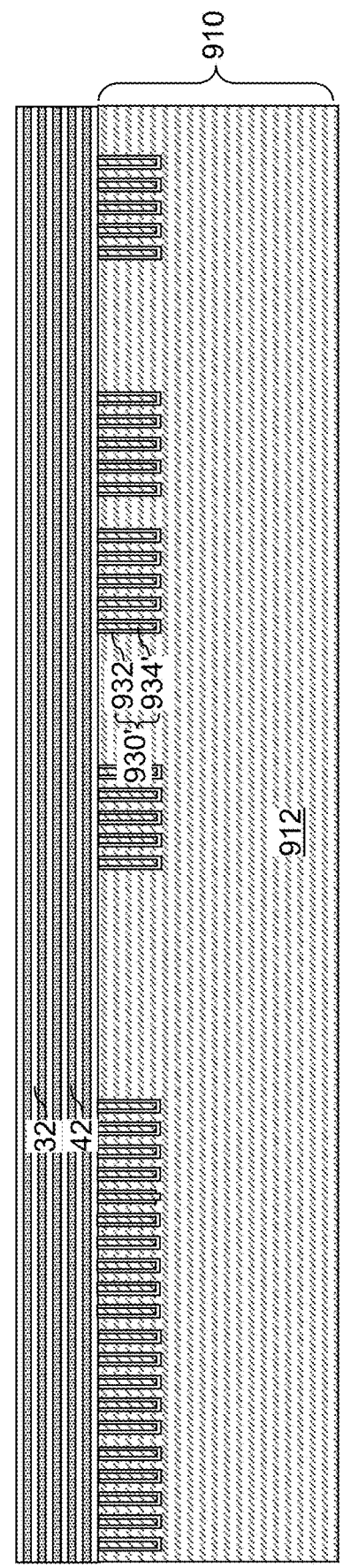
FIG. 1
FIG. 2

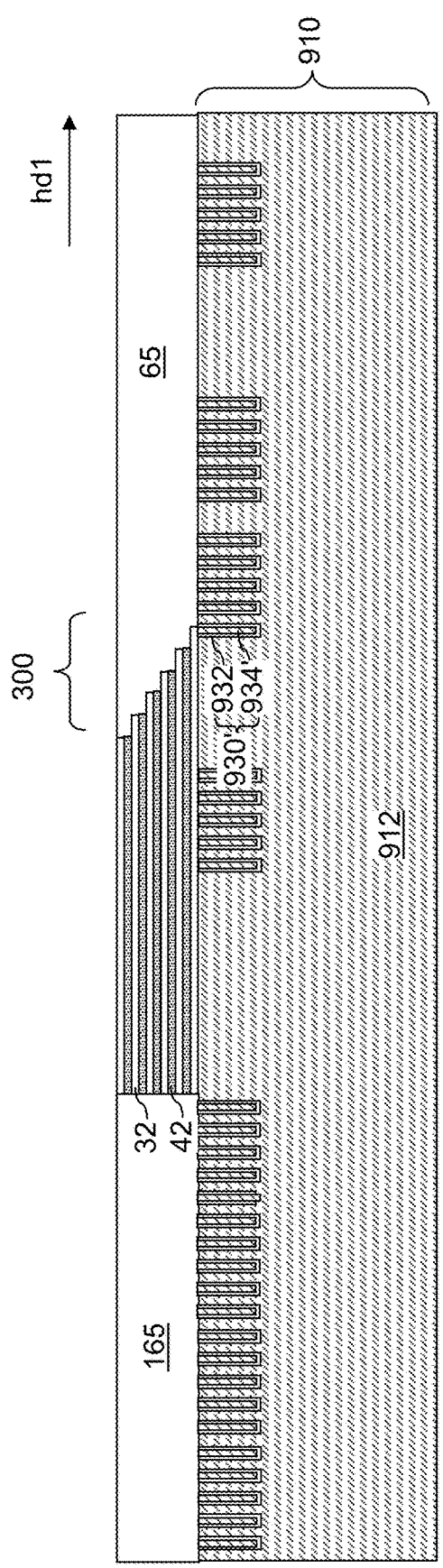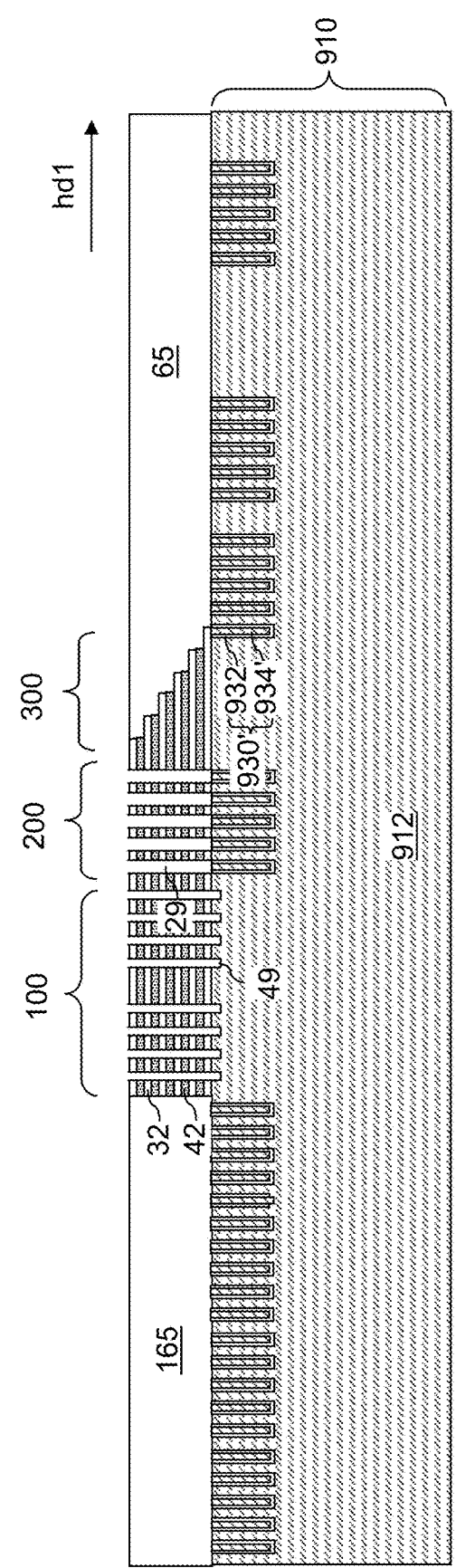

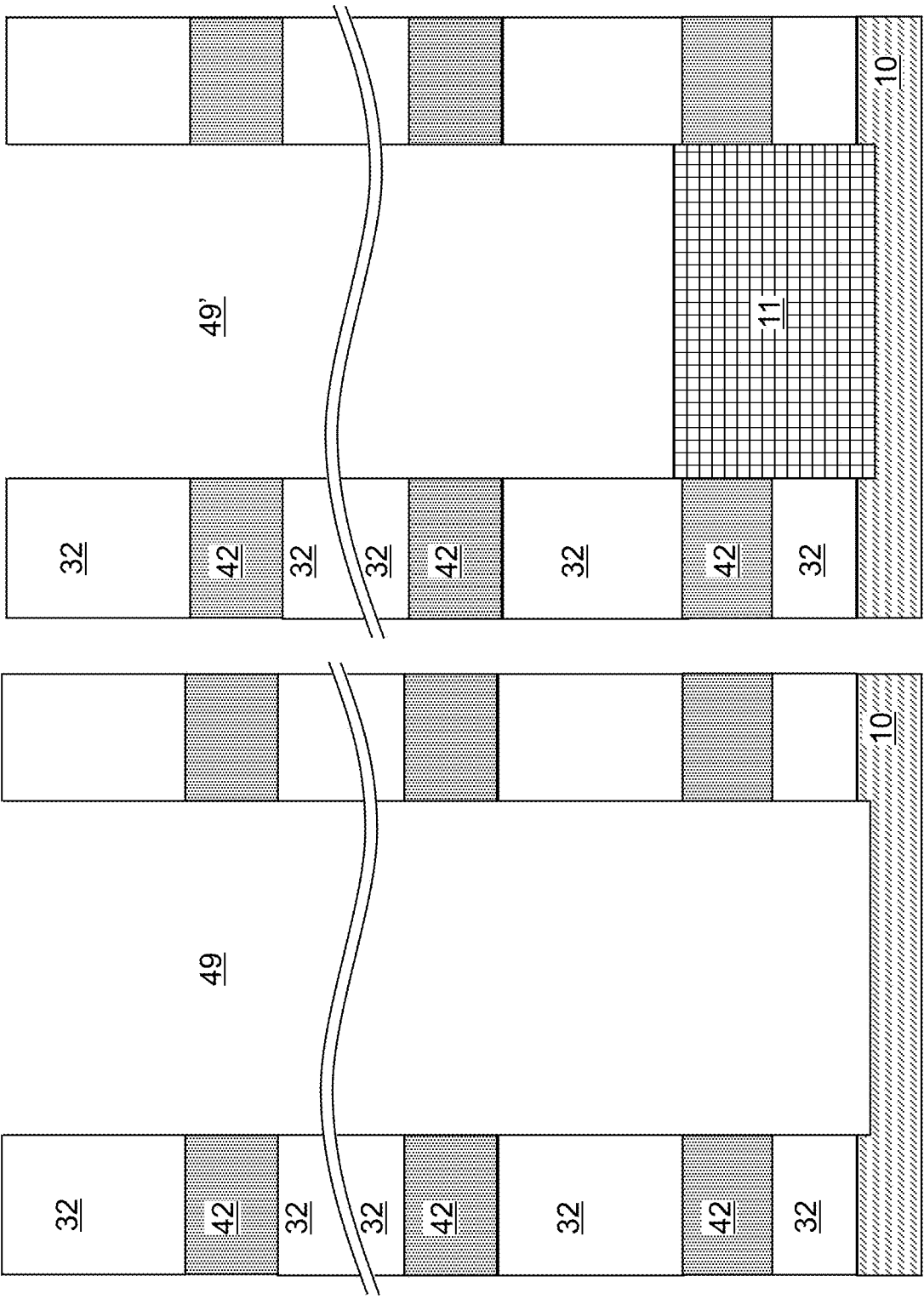

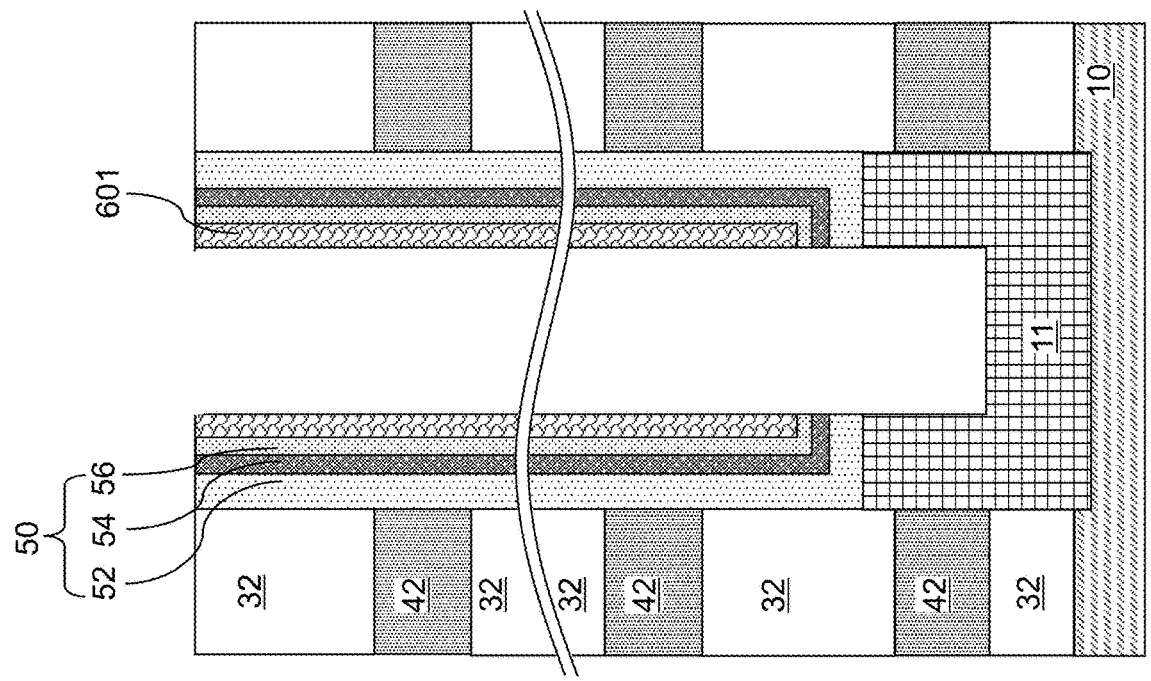
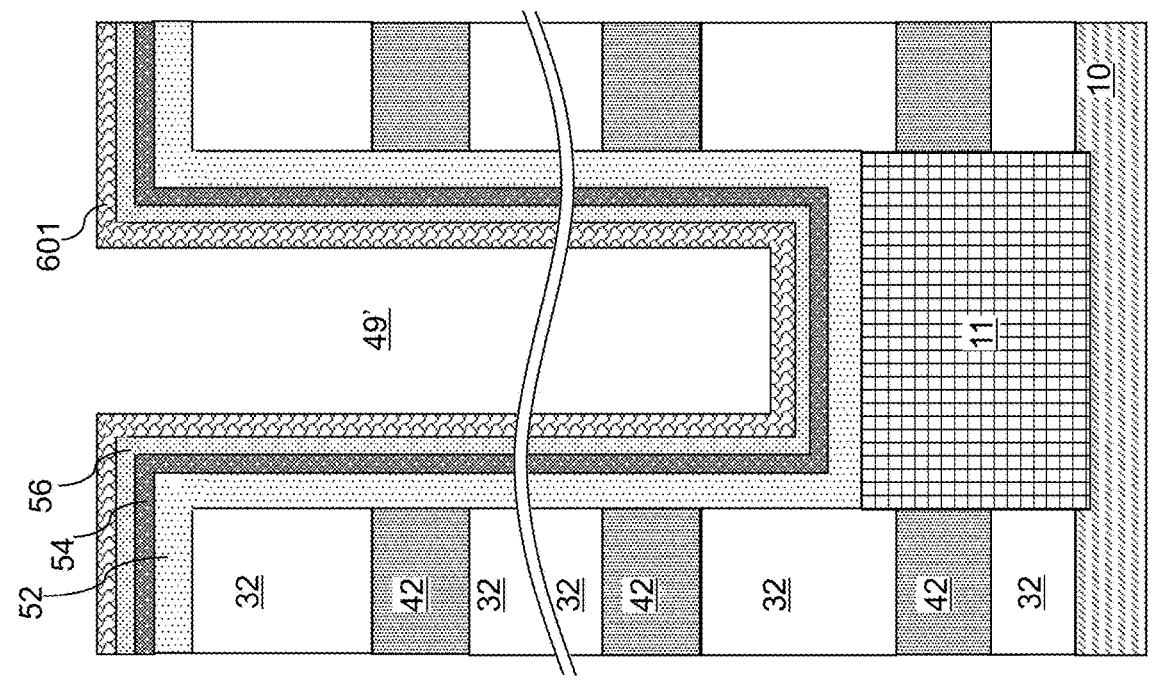

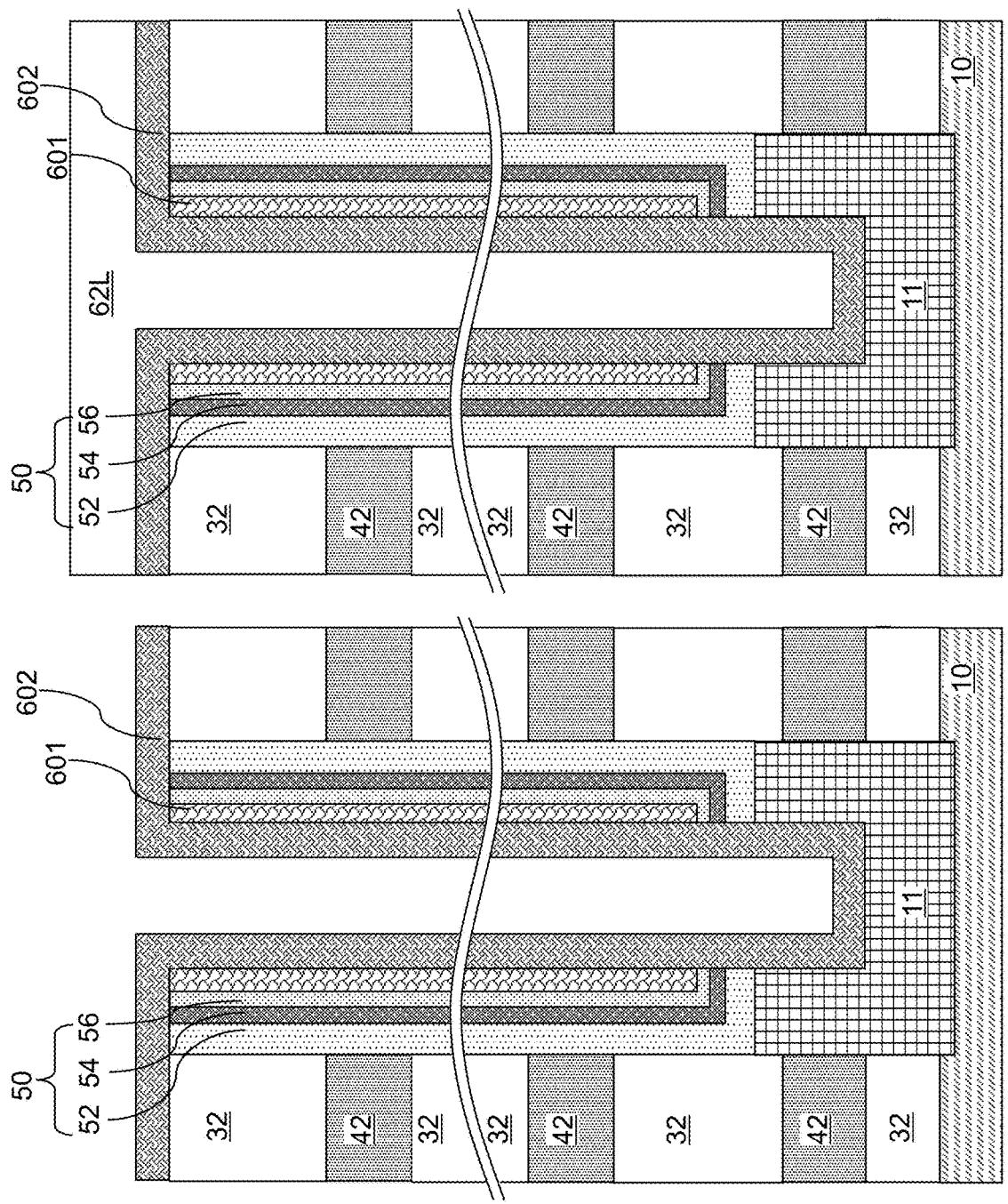

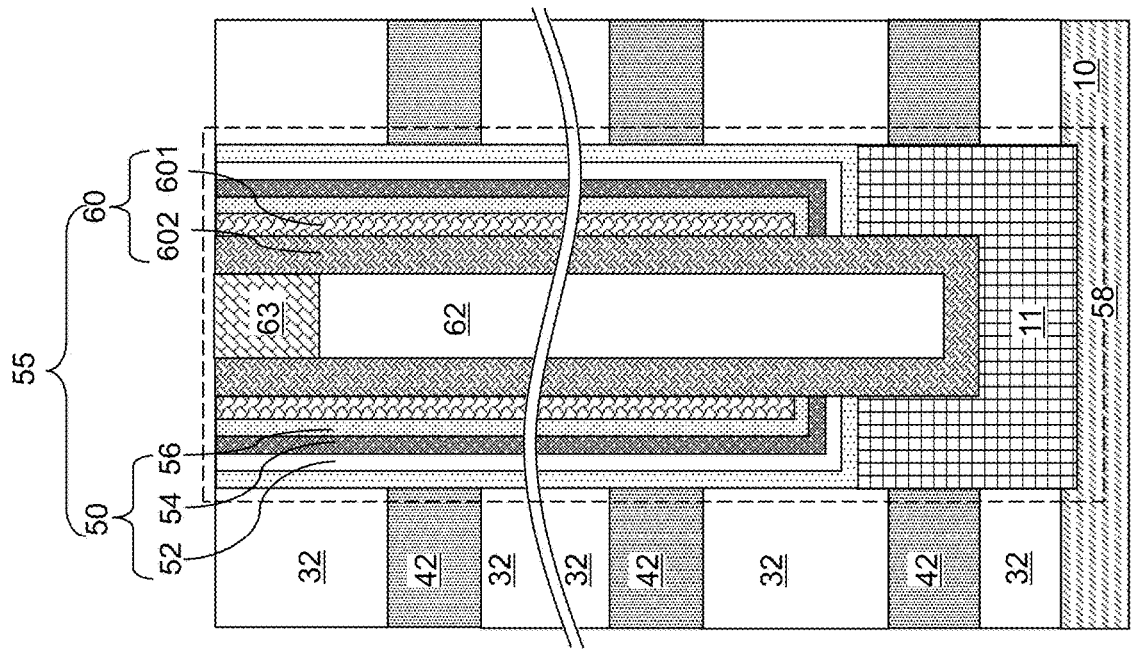
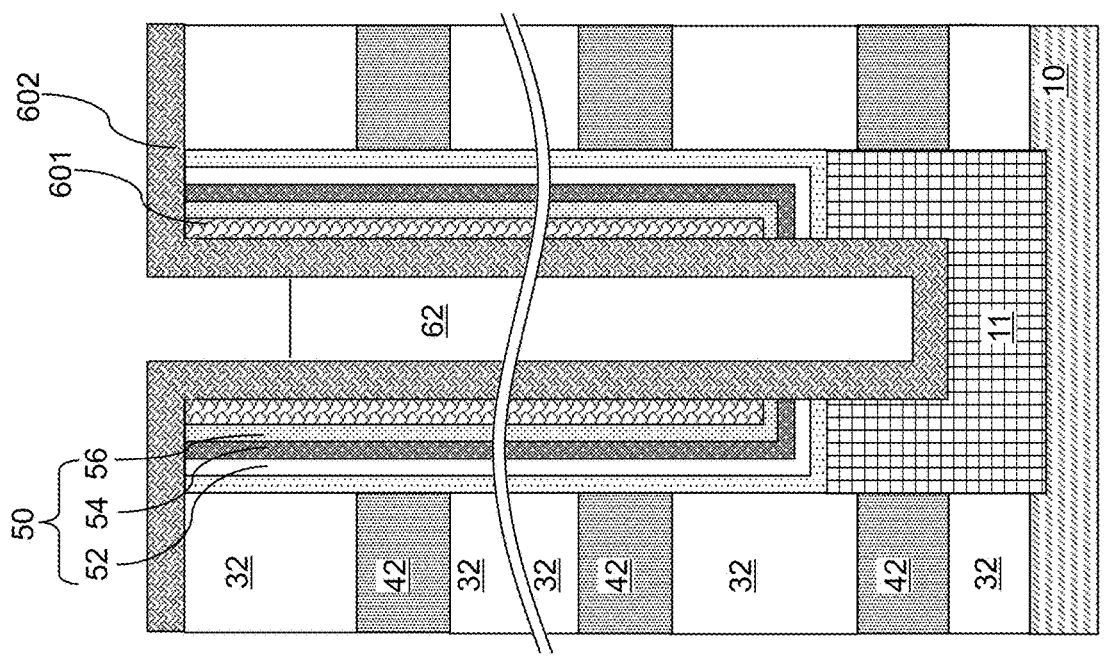

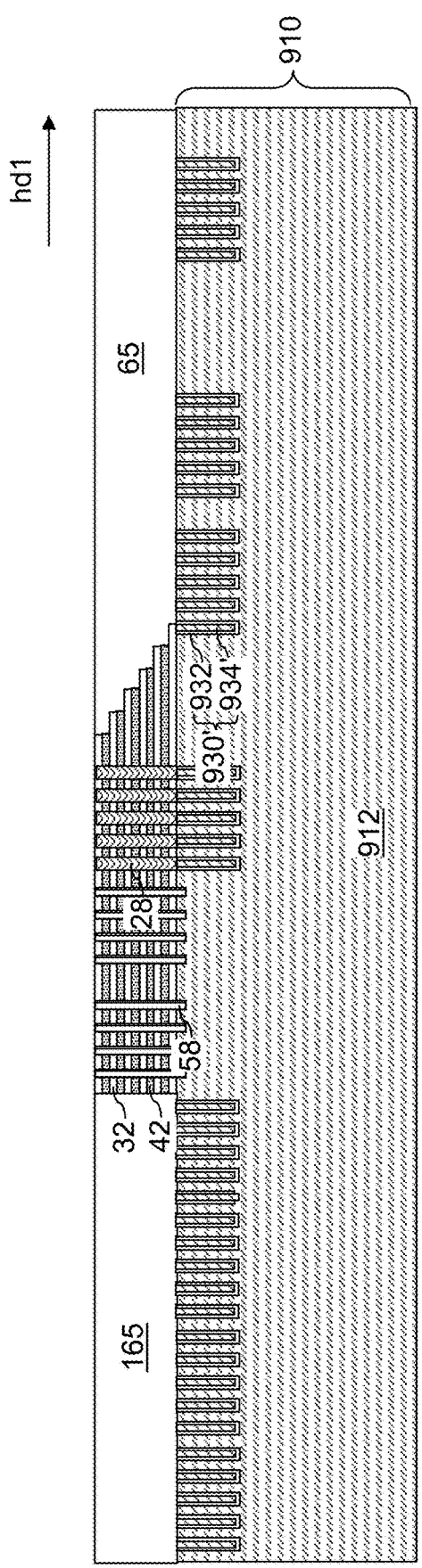
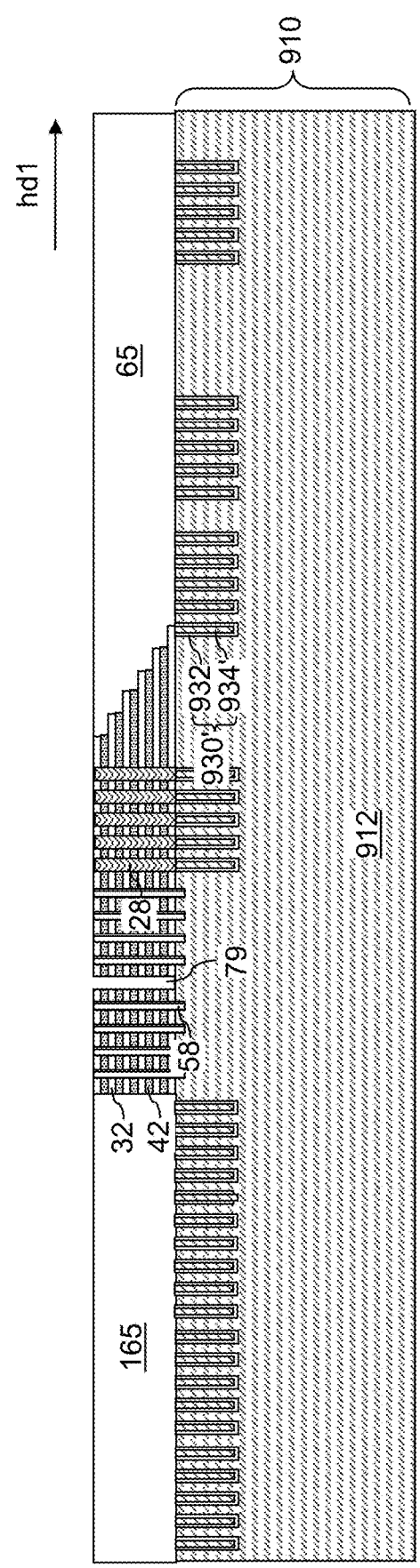
FIG. 7
FIG. 8

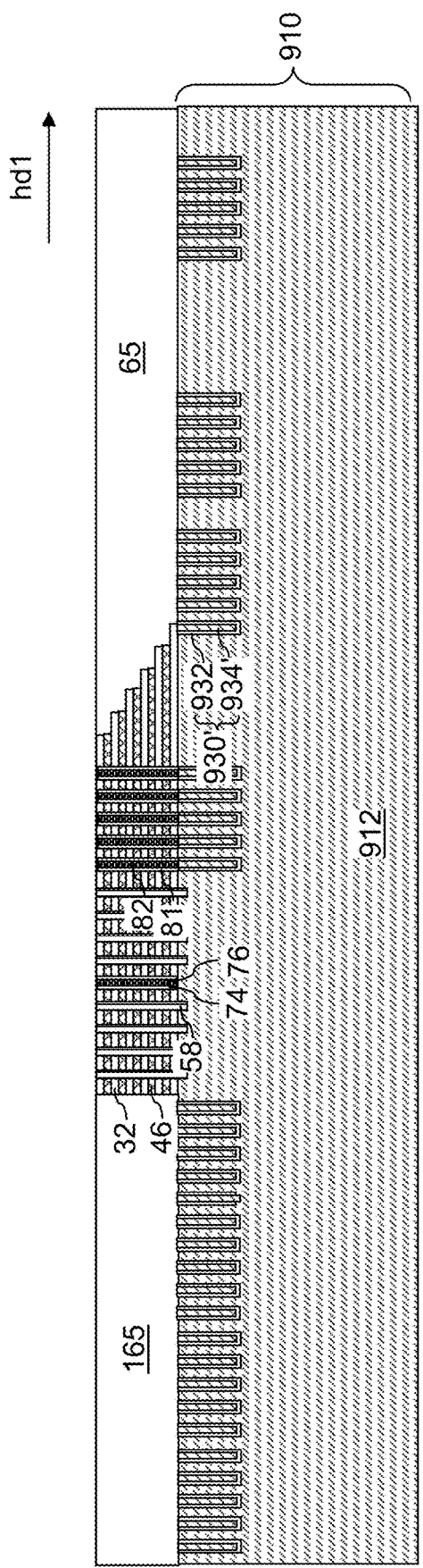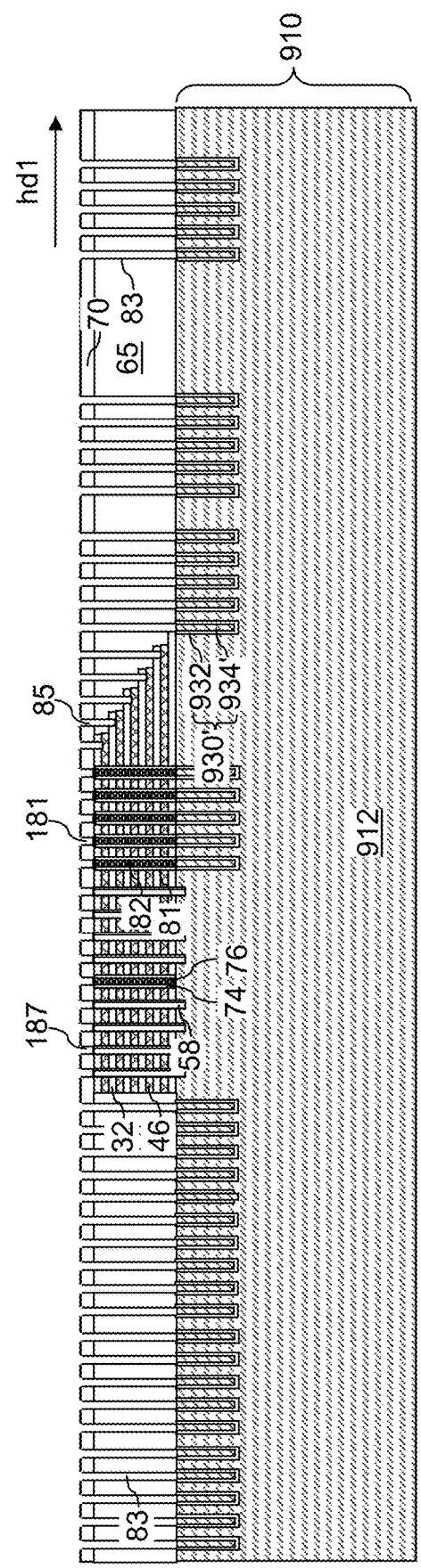
FIG. 13
FIG. 14

BONDED SEMICONDUCTOR DIE ASSEMBLY CONTAINING THROUGH-STACK VIA STRUCTURES AND METHODS FOR MAKING THE SAME

FIELD

The present disclosure relates generally to the field of semiconductor devices, and particular to a bonded semiconductor die assembly containing through-stack via structures and methods of forming the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a bonded assembly includes a first three-dimensional memory die comprising a first alternating stack of first insulating layers and first electrically conductive layers, first memory structures located in the first alternating stack, and a first stepped dielectric material portion contacting stepped surfaces of the first alternating stack, a second three-dimensional memory die bonded to the first three-dimensional memory die, wherein the second three-dimensional memory die comprises a second alternating stack of second insulating layers and second electrically conductive layers, second memory structures located in the second alternating stack, and a second stepped dielectric material portion contacting stepped surfaces of the second alternating stack, and driver circuit devices. The first electrically conductive layers have different lateral extents along the first horizontal direction that decrease with a respective vertical distance from the driver circuit devices, and the second electrically conductive layers have different lateral extents along the first horizontal direction that increase with the respective vertical distance from the driver circuit devices.

According to another embodiment of the present disclosure, a method of forming a bonded assembly comprises providing a first three-dimensional memory die comprising a first alternating stack of first insulating layers and first electrically conductive layers, first memory structures located in the first alternating stack, and a first stepped dielectric material portion contacting stepped surfaces of the first alternating stack, and bonding a second three-dimensional memory die to the first three-dimensional memory die, wherein the second three-dimensional memory die comprises a second alternating stack of second insulating layers and second electrically conductive layers, second memory structures located in the second alternating stack, and a second stepped dielectric material portion contacting stepped surfaces of the second alternating stack. The first three-dimensional memory die is located between driver circuit devices and the second three-dimensional memory die, the first electrically conductive layers have different lateral extents along the first horizontal direction that decrease with a respective vertical distance from the driver circuit devices, and the second electrically conductive layers have different lateral extents along the first horizontal direction that increase with the respective vertical distance from the driver circuit devices.

BRIEF DESCRIPTION OF THE DRAWINGS

FIG. 1 is a vertical cross-sectional view of a first exemplary structure after formation of in-process laterally-isolated through-substrate via structures and substrate insulating spacers in a first substrate according to a first embodiment of the present disclosure.

FIG. 2 is a vertical cross-sectional view of the first exemplary structure after formation of a first alternating stack of first insulating layers and first sacrificial material layers according to the first embodiment of the present disclosure.

FIG. 3 is a vertical cross-sectional view of the first exemplary structure after patterning a first stepped dielectric material portion and a first non-stepped dielectric material portion according to the first embodiment of the present disclosure.

FIG. 4 is a vertical cross-sectional view of the first exemplary structure after formation of memory openings and connection via openings according to the first embodiment of the present disclosure.

FIGS. 6A-6H illustrate sequential vertical cross-sectional views of a memory opening during formation of a memory opening fill structure according to the first embodiment of the present disclosure.

FIG. 7 is a vertical cross-sectional view of the first exemplary structure after formation of memory opening fill structures according to the first embodiment of the present disclosure.

FIG. 8 is a vertical cross-sectional view of the first exemplary structure after formation of backside trenches according to the first embodiment of the present disclosure.

FIG. 13 is a vertical cross-sectional view of the first exemplary structure after formation of backside contact via structures in the backside trenches and first laterally-isolated through-stack via structures according to the first embodiment of the present disclosure.

FIG. 14 is a vertical cross-sectional view of the first exemplary structure after formation of a contact-level dielectric layer and various contact via cavities according to the first embodiment of the present disclosure.

DETAILED DESCRIPTION

Figure 5:
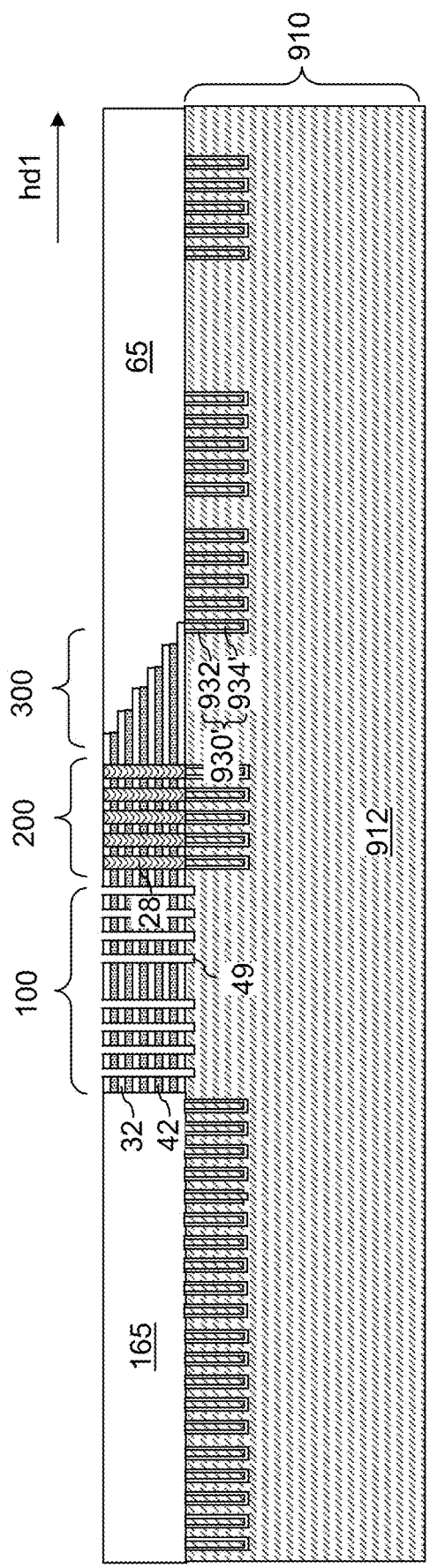
FIG. 5 is a vertical cross-sectional view of the first exemplary structure after formation of sacrificial connection via opening fill structures according to the first embodiment of the present disclosure.

The performance of a memory package may be enhanced by bonding at least one three-dimensional memory die with a logic die including a peripheral circuitry for operating the three-dimensional memory array(s) within the at least one three-dimensional memory die. As discussed above, the embodiments of the present disclosure are directed to a bonded semiconductor die assembly containing through-stack via structures and methods of forming the same, the various aspects of which are described herein in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device.

The various three-dimensional memory devices of the present disclosure include a three-dimensional NAND string memory device, and may be fabricated using the various embodiments described herein. The three-dimensional NAND string may be located in a monolithic, three-dimensional array of NAND strings. The driver circuits may be formed on the same substrate and the NAND strings or on a different substrate from the NAND strings followed by bonding the driver circuit to the NAND stings. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, a first exemplary structure according to a first embodiment of the present disclosure is illustrated, which can be employed, for example, to fabricate a three-dimensional memory die including a three-dimensional array of memory elements, such as a three-dimensional array of NAND memory elements or a three-dimensional array of NOR memory elements. While the present disclosure is described employing a three-dimensional array of NAND memory elements, embodiments of the present disclosure can be employed to form a three-dimensional array of NOR memory elements, or other types of three-dimensional memory elements.

The first exemplary structure includes a substrate 910, which includes a semiconductor material layer 912 at least at an upper portion thereof. In one embodiment, the substrate 910 may be a bulk semiconductor substrate such as a commercially available silicon wafer having a diameter in a range from 150 mm to 450 mm and a thickness in a range from 600 microns to 1 mm, or may be a semiconductor-on-insulator (e.g., silicon-on-insulator, SOI) substrate that includes the semiconductor material layer as a top semiconductor layer overlying a buried oxide layer. Optionally, deep trenches can be formed through an upper portion of the substrate 910, and a combination of a substrate insulating spacer 932 and an in-process laterally-isolated through-substrate via structure 934' can be formed within each deep trench. The depth of each deep trench may be in a range from 1 micron to 20 microns, such as from 2 microns to 10 microns, and the maximum lateral dimension of each deep trench may be in a range from 1 micron to 20 microns, such as from 2 microns to 10 microns, although lesser and greater depths and maximum lateral dimensions can be employed for the deep trenches. Each deep trench may have a horizontal cross-sectional shape of a circle, an ellipse, a rectangle, a rounded rectangle, or a generally curvilinear two-dimensional closed shape. A conformal insulating material layer including an insulating material such as silicon oxide, silicon nitride, silicon oxynitride, and/or a dielectric metal oxide can be deposited in the deep trenches by a conformal deposition process. At least one conductive fill material such as at least one metallic material and/or a heavily doped semiconductor material can be deposited in remaining volumes of the deep trenches after formation of the conformal insulating material layer. Excess portions of the conformal insulating material layer and the at least one metallic material can be removed from above the horizontal plane including the top surface of the substrate 910 by a planarization process such as a chemical mechanical planarization process. Each remaining portion of the conformal insulating material layer constitutes a substrate insulating spacer 932, and each remaining portion of the at least one conductive material constitutes an in-process laterally-isolated through-substrate via structure 934'. Each contiguous combination of a substrate insulating spacer 932 and an in-process laterally-isolated through-substrate via structure 934' constitutes an in-process through-substrate connection structure 930'. Alternatively, the in-process through-substrate connection structure 930' can be omitted at this stage in the process, and the connection structures can be formed during a subsequent process step.

Referring to FIG. 2, an alternating stack of insulating layers 32 and sacrificial material layers 42 is formed over the top surface of the substrate 910. In one embodiment, the alternating stack (32, 42) can include insulating layers 32 composed of a first material, and sacrificial material layers 42 composed of a second material that is different from the first material and can be subsequently removed selective to the first material. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers 42 can include silicon nitride. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD). The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed.

While the present disclosure is described employing an embodiment in which the spacer material layers are sacrificial material layers 42 that are subsequently replaced with electrically conductive layers, embodiments are expressly contemplated herein in which electrically conductive layers are formed in lieu of the sacrificial material layers 42. In this case, subsequently processing steps for replacing the sacrificial material layers 42 with electrically conductive layers can be omitted.

Referring to FIG. 3, the alternating stack (32, 42) can be patterned to form stepped surfaces at least one side. As used herein, "stepped surfaces" refer to a set of surfaces that include at least two horizontal surfaces and at least two vertical surfaces such that each horizontal surface is adjoined to a bottom edge of a respective vertical surface, and a top edge of each vertical surface is adjoined to an edge of a respective horizontal surface. A stepped cavity is formed within the volume from which portions of the alternating stack (32, 42) are removed through formation of the stepped surfaces. A "stepped cavity" refers to a cavity having stepped surfaces. Optionally, a non-stepped cavity may be formed on an opposite side of the stepped cavity. As used herein, a non-stepped cavity refers to a cavity without stepped surfaces. Thus, a non-stepped cavity can include straight sidewalls that vertically extend from a bottommost surface of the alternating stack (32, 42) to a topmost surface of the alternating stack (32, 42).

The stepped cavity can have various stepped surfaces such that the horizontal cross-sectional shape of the stepped cavity changes in steps as a function of the vertical distance from the top surface of the substrate 910. In one embodiment, the stepped cavity can be formed by repetitively performing a set of processing steps. The set of processing steps can include, for example, an etch process of a type that vertically increases the depth of a cavity by one or more levels, and an etch process of a second type that laterally expands the area to be vertically etched in a subsequent etch process of the type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in a terrace region 300. The terrace region 300 includes stepped surfaces of the alternating stack (32, 42) that continuously extend from a bottommost layer within the alternating stack (32, 42) to a topmost layer within the alternating stack (32, 42). Each of the sacrificial material layers 42 has a respective lateral extent. The sacrificial material layers 42 can have different lateral extents along a horizontal direction hd1. In one embodiment, the lateral extents of the sacrificial material layers 42 can increase with a respective vertical distance from the top surface of the substrate 910. Each of the insulating layers 32 has a respective lateral extent. The insulating layers 32 can have different lateral extents along the horizontal direction hd1 (e.g., word line direction). In one embodiment, the lateral extents of the insulating layers 32 can increase with a respective vertical distance from the top surface of the substrate 910. A second horizontal direction (e.g., bit line direction) can be defined as the horizontal direction that is perpendicular to the horizontal direction hd1.

A stepped dielectric material portion 65 can be formed in the stepped cavity by deposition of a dielectric material therein. For example, a dielectric material such as silicon oxide can be deposited in the stepped cavity. Excess portions of the deposited dielectric material can be removed from above the top surface of the alternating stack (32, 42), for example, by chemical mechanical planarization (CMP). The remaining portion of the deposited dielectric material filling the stepped cavity constitutes the stepped dielectric material portion 65. If silicon oxide is employed for the stepped dielectric material portion 65, the silicon oxide of the stepped dielectric material portion 65 may, or may not, be doped with dopants such as B, P, and/or F. A non-stepped dielectric material portion 165 can be formed in the non-stepped cavity concurrently with formation of the stepped dielectric material portion 65.

Referring to FIG. 4, a lithographic material stack (not shown) including at least a photoresist layer can be formed over the alternating stack (32, 42) and the stepped dielectric material portion 65, and can be lithographically patterned to form openings therein. The openings include a set of openings formed over a memory array region 100 and a second set of openings formed over a connection region 200 that is adjacent to the stepped surfaces. The memory array region 100 and the connection region 200 are located within the area in which each layer of the alternating stack (32, 42) is present. The memory array region 100 can be laterally spaced from the terrace region 300 by the connection region 200. In other words, the connection region 200 can be located between the memory array region 100 and the terrace region 300.

The pattern in the lithographic material stack can be transferred through the alternating stack (32, 42) or the stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and connection via openings 29. As used herein, a "memory opening" refers to a structure in which memory elements, such as a memory stack structure, is subsequently formed. As used herein, a "connection via opening" refers to a structure in which connection via structure is subsequently formed. The memory openings 49 are formed through each layer of the alternating stack (32, 42) in the memory array region 100. The connection via openings 29 are formed through each layer of the alternating stack (32, 42) in the connection region 200. A top surface of an in-process laterally-isolated through-substrate via structure 934' (if present) can be physically exposed at the bottom of each connection via opening 29. Alternatively, the connection via openings 29 can be formed during a subsequent step in the process. Optionally, support openings (not shown) can be formed in addition to the memory openings 49 and the connection via openings 29. In this case, a support pillar structure (not shown) including a dielectric material or a same set of materials as a memory opening fill structure can be subsequently formed within each support opening.

The chemistry of the anisotropic etch process employed to etch through the materials of the alternating stack (32, 42) can alternate to optimize etching of the and second materials in the alternating stack (32, 42). The anisotropic etch can be, for example, a series of reactive ion etches. The sidewalls of the memory openings 49 and the connection via openings 29 can be substantially vertical, or can be tapered. The patterned lithographic material stack can be subsequently removed, for example, by ashing. The memory openings 49 and the connection via openings 29 can extend from the top surface of the alternating stack (32, 42) to at least the horizontal plane including the topmost surface of the semiconductor material layer 912. The lithographic mask stack can be subsequently removed, for example, by ashing.

Each of the memory openings 49 and the connection via openings 29 may include a sidewall (or a plurality of sidewalls) that extends substantially perpendicular to the topmost surface of the substrate 910. A two-dimensional array of memory openings 49 can be formed in the memory array region 100. A two-dimensional array of connection via openings 29 can be formed in the connection region 200.

Referring to FIG. 5, a sacrificial fill material can be deposited in the memory openings 49 and the connection via openings 29. The sacrificial fill material is different from the materials of the semiconductor material layer 912, the insulating layers 32, and the sacrificial material layers 42. For example, if the insulating layers 32 include silicon oxide and if the sacrificial material layers 42 include silicon nitride, the sacrificial fill material can include amorphous carbon, amorphous silicon, a silicon-germanium alloy, a silicon-based polymer, organosilicate glass, or another material that can be removed selective to the materials of the semiconductor material layer 912, the insulating layers 32, and the sacrificial material layers 42. Excess portions of the sacrificial fill material layer can be removed from above the horizontal plane including the top surface of the alternating stack (32, 42) by a planarization process such as a chemical mechanical planarization process. Further, a photoresist layer (not shown) can be applied over the alternating stack (32, 42), and can be lithographically patterned to cover the connection region 200 without covering the memory array region 100. Portions of the sacrificial fill material filling the memory openings 49 can be removed by an etch process, which may employ an isotropic etch process or an anisotropic etch process. The photoresist layer can be subsequently removed, for example, by ashing. Each remaining portion of the sacrificial fill material that fills a connection via opening 29 constitutes a sacrificial connection via opening fill structure 28. Each sacrificial connection via opening fill structure 28 can have a cylindrical shape with at least one straight sidewall that vertically extends from the bottommost surface of the alternating stack (32, 42) to the topmost surface of the alternating stack (32, 42). Each sacrificial connection via opening fill structure 28 may have a maximum lateral dimension in a range from 200 nm to 2,000 nm, such as from 400 nm to 1,000 nm, although lesser and greater maximum lateral dimensions can be employed for the sacrificial connection via opening fill structure 28. Each sacrificial connection via opening fill structure 28 may have a horizontal cross-sectional shape of a circle, an ellipse, a rectangle, a rounded rectangle, or a generally curvilinear two-dimensional closed shape. Alternatively, the steps shown in FIGS. 4 and 5 and the sacrificial connection via opening fill structures 28 may be omitted if the connection via openings 29 are formed during a subsequent process step.

FIGS. 6A-6H illustrate structural changes in a memory opening 49, which is one of the memory openings 49 in the first exemplary structure of FIG. 5. Referring to FIG. 6A, a memory opening 49 in the exemplary device structure of FIG. 5 is illustrated. The memory opening 49 extends through the alternating stack (32, 42), and optionally into an upper portion of the semiconductor material layer 912. The recess depth of the bottom surface of each memory opening 49 with respect to the top surface of the semiconductor material layer 912 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 6B, an optional pedestal channel portion (e.g., an epitaxial pedestal) 11 can be formed at the bottom portion of each memory opening 49, for example, by selective epitaxy. Each pedestal channel portion 11 may comprise a single crystalline semiconductor material in epitaxial alignment with the single crystalline semiconductor material of the semiconductor material layer 912 in case the semiconductor material layer 912 is single crystalline. In one embodiment, the pedestal channel portion 11 can be doped with electrical dopants of the same conductivity type as the semiconductor material layer 912.

Referring to FIG. 6C, a stack of layers including a blocking dielectric layer 52, a charge storage layer 54, a tunneling dielectric layer 56, and an optional semiconductor channel layer 601 can be sequentially deposited in the memory openings 49.

Referring to FIG. 5D, the optional semiconductor channel layer 601, the tunneling dielectric layer 56, the charge storage layer 54, the blocking dielectric layer 52 are sequentially anisotropically etched employing at least one anisotropic etch process. The portions of the semiconductor channel layer 601, the tunneling dielectric layer 56, the charge storage layer 54, and the blocking dielectric layer 52 located above the top surface of the alternating stack (32, 42) can be removed by the at least one anisotropic etch process. Further, the horizontal portions of the semiconductor channel layer 601, the tunneling dielectric layer 56, the charge storage layer 54, and the blocking dielectric layer 52 at a bottom of each memory cavity 49' can be removed to form openings in remaining portions thereof. Each of the semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 912 in case the pedestal channel portions 11 are not employed) can be physically exposed underneath the opening through the semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 912 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (e.g., portions of the charge storage layer 54) that are insulated from surrounding materials by the blocking dielectric layer 52 and the tunneling dielectric layer 56. In one embodiment, the semiconductor channel layer 601, the tunneling dielectric layer 56, the charge storage layer 54, and the blocking dielectric layer 52 can have vertically coincident sidewalls.

Referring to FIG. 6E, a second semiconductor channel layer 602 can be deposited directly on the semiconductor surface of the pedestal channel portion 11 or the semiconductor material layer 912 if the pedestal channel portion 11 is omitted, and directly on the semiconductor channel layer 601. The second semiconductor channel layer 602 may partially fill the memory cavity 49' in each memory opening, or may fully fill the cavity in each memory opening. The materials of the semiconductor channel layer 601 and the second semiconductor channel layer 602 are collectively referred to as a semiconductor channel material. In other words, the semiconductor channel material is a set of all semiconductor material in the semiconductor channel layer 601 and the second semiconductor channel layer 602.

Referring to FIG. 6F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 6G, the horizontal portion of the dielectric core layer 62L can be removed, for example, by a recess etch from above the top surface of the alternating stack (32, 42). Each remaining portion of the dielectric core layer 62L constitutes a dielectric core 62. Further, the horizontal portion of the second semiconductor channel layer 602 located above the top surface of the alternating stack (32, 42) can be removed by a planarization process, which can employ a recess etch or chemical mechanical planarization (CMP). Each remaining portion of the second semiconductor channel layer 602 can be located entirety within a memory opening 49 or entirely within a connection via opening 29.

Each adjoining pair of a semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 6H, the top surface of each dielectric core 62 can be further recessed within each memory opening, for example, by a recess etch to a depth that is located between the top surface of the alternating stack (32, 42) and the bottom surface of the alternating stack (32, 42). Drain regions 63 can be formed by depositing a doped semiconductor material within each recessed region above the dielectric cores 62. The drain regions 63 can have a doping of a second conductivity type that is the opposite of the conductivity type. For example, if the conductivity type is p-type, the second conductivity type is n-type, and vice versa. The dopant concentration in the drain regions 63 can be in a range from $5.0\times10^{19}/cm^3$ to $2.0\times10^{21}/cm^3$, although lesser and greater dopant concentrations can also be employed. The doped semiconductor material can be, for example, doped polysilicon. Excess portions of the deposited semiconductor material can be removed from above the top surface of the alternating stack (32, 42), for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer 56, a charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure 58.

Referring to FIG. 7, the first exemplary structure is illustrated after formation of memory opening fill structures 58 within the memory openings 49. An instance of a memory opening fill structure 58 can be formed within each memory opening 49 of the structure of FIG. 5. Each memory stack structure 55 includes a vertical semiconductor channel 60, which may comprise multiple semiconductor channel layers (601, 602) or single semiconductor channel layer 602, and a memory film 50. The memory film 50 may comprise a tunneling dielectric layer 56 laterally surrounding the vertical semiconductor channel 60 and a vertical stack of charge storage regions (e.g., comprising portions of the charge storage layer 54) laterally surrounding the tunneling dielectric layer 56 and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Generally, the memory openings 49 vertically extending through each layer within the alternating stack (32, 42). Memory opening fill structures 58 are located in the memory openings 49. Each memory opening fill structure 58 comprises a respective vertical semiconductor channel 60 and a respective memory film 50. A three-dimensional array of memory elements is provided, which comprises portions of the memory films 50. For example, the three-dimensional array of memory elements can comprise portions of the charge storage layer 54 that are located at levels of the sacrificial material layers 42. In one embodiment, each memory elements can include a cylindrical portion of a respective charge storage layer 54 that contacts a respective sacrificial material layer 42. The substrate 910 can comprise a semiconductor material layer 912 in electrical contact with a bottom end of each of the vertical semiconductor channels 60.

Referring to FIG. 8, a photoresist layer (not shown) can be applied over the alternating stack (32, 42), the stepped dielectric material portion 65, and the non-stepped dielectric material portion 165, and is lithographically patterned to form openings in areas between clusters of memory opening fill structures 58. The pattern in the photoresist layer can be transferred through the alternating stack (32, 42) and/or the stepped dielectric material portion 65 employing an anisotropic etch to form backside trenches 79, which vertically extend from the top surface of the alternating stack (32, 420) at least to the top surface of the substrate 910. In one embodiment, the backside trenches 79 may be laterally elongated along a horizontal direction.

Figure 9:
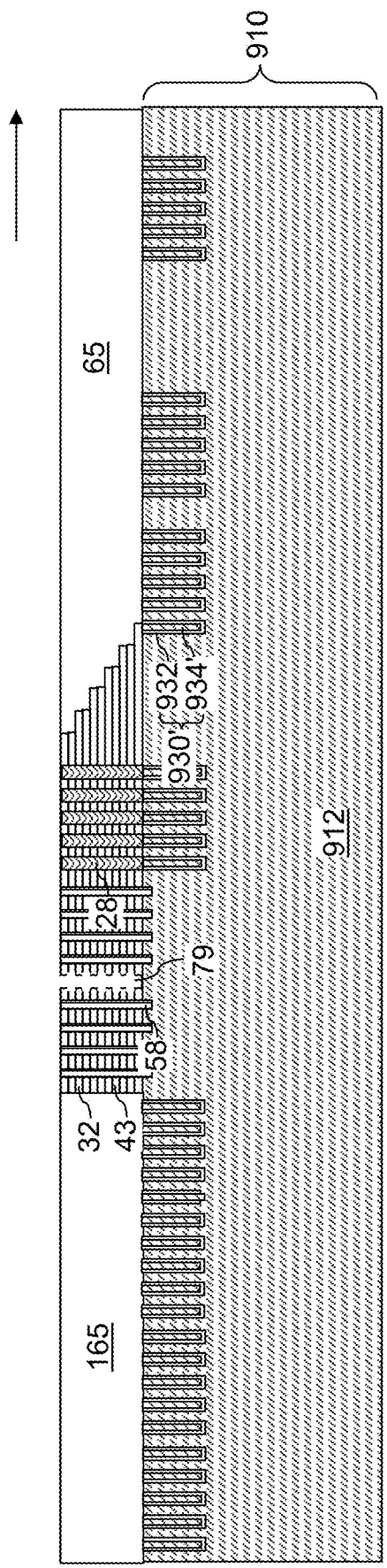
FIG. 9 is a vertical cross-sectional view of the first exemplary structure after formation of backside recesses according to the first embodiment of the present disclosure.

Referring to FIG. 9, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the stepped dielectric material portion 65 and the non-stepped dielectric material portion 165, the semiconductor material of the semiconductor material layer 912, and the material of the outermost layer of the memory films 50. In one embodiment, the sacrificial material layers 42 can include silicon nitride, and the materials of the insulating layers 32, the stepped dielectric material portion 65, and the non-stepped dielectric material portion 165 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The stepped dielectric material portion 65 and the memory opening fill structures 58 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate 910. In this case, each backside recess 43 can define a space for receiving a respective word line of the array of monolithic three-dimensional NAND strings.

Each of the plurality of backside recesses 43 can extend substantially parallel to the top surface of the substrate 910. A backside recess 43 can be vertically bounded by a top surface of an underlying insulating layer 32 and a bottom surface of an overlying insulating layer 32. In one embodiment, each backside recess 43 can have a uniform height throughout. Physically exposed surface portions of the optional pedestal channel portions 11 and the semiconductor material layer 912 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer, and to convert each physically exposed surface portion of the semiconductor material layer 912 into a planar dielectric portion.

Figure 10:
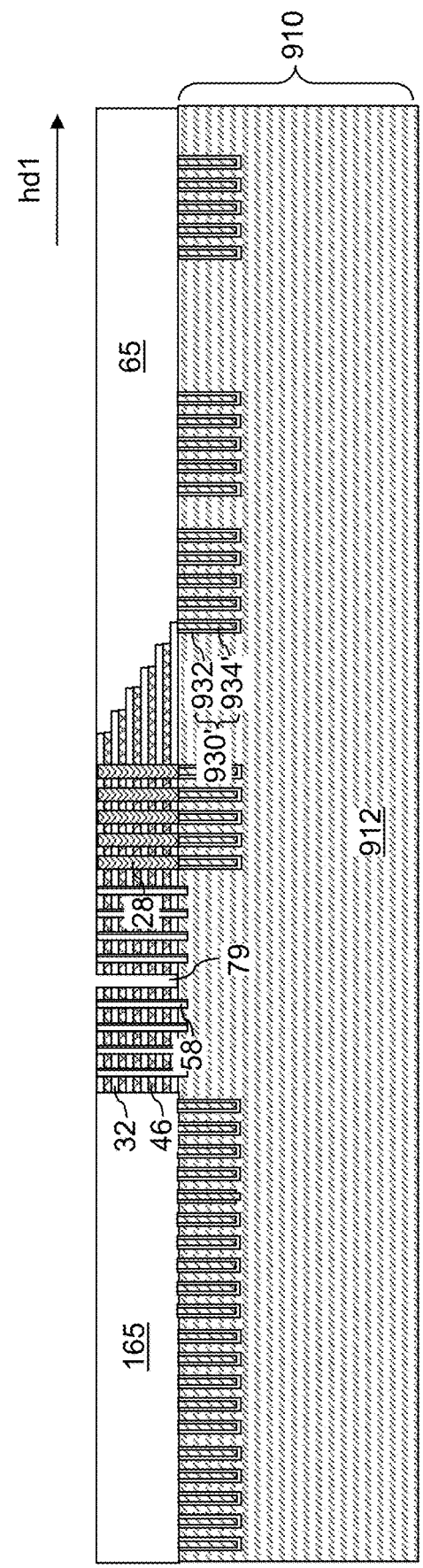
FIG. 10 is a vertical cross-sectional view of the first exemplary structure after formation of electrically conductive layers according to the first embodiment of the present disclosure.

Referring to FIG. 10, a backside blocking dielectric layer (not shown) can be optionally formed. At least one metallic material can be deposited in the backside recesses 43 by at least one conformal deposition process. For example, a combination of a metallic barrier layer and a metallic fill material can be deposited in the backside recesses 43. The metallic barrier layer includes an electrically conductive metallic material that can function as a diffusion barrier layer and/or adhesion promotion layer for the metallic fill material. The metallic barrier layer can include a conductive metallic nitride material such as TiN, TaN, WN, or a stack thereof, or can include a conductive metallic carbide material such as TIC, TaC, WC, or a stack thereof. The metal fill material is deposited in remaining volumes of backside recesses 43, on the sidewalls of the at least one the backside trench 79, and over the top surface of the topmost insulating layer 32. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum.

Portions of the at least one conductive material deposited at peripheral regions of the backside trenches 79 or above the topmost insulating layer 32 can be removed by an isotropic etch back process. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46, and an alternating stack of the insulating layers 32 and the electrically conductive layers 46 is formed.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

Figure 11:
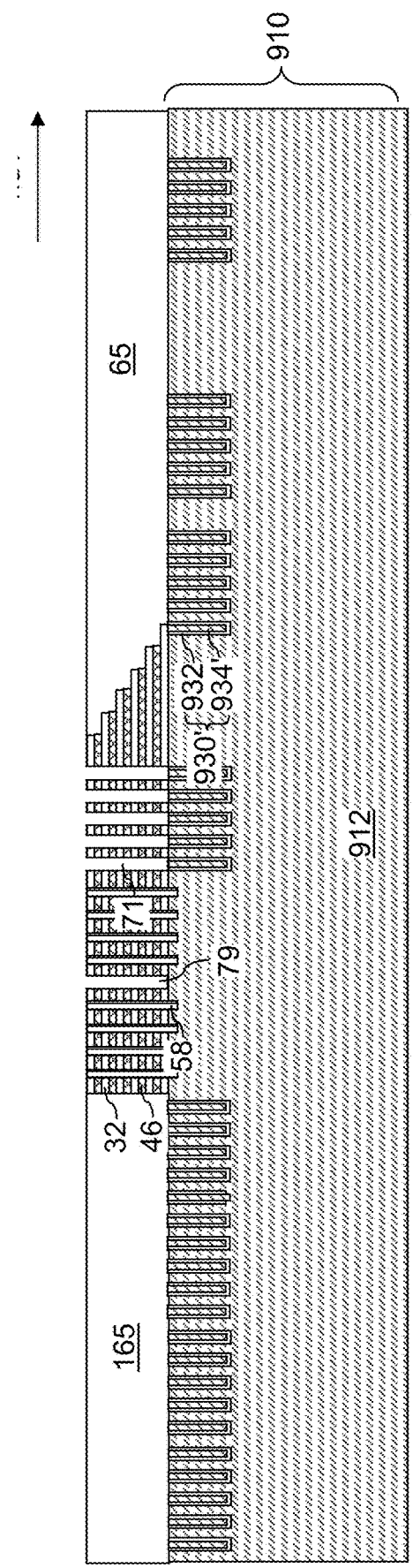
FIG. 11 is a vertical cross-sectional view of the first exemplary structure after removal of the sacrificial connection via opening fill structures from the connection via openings according to the first embodiment of the present disclosure.

Referring to FIG. 11, connection via cavities 71 can be formed by removing the sacrificial connection via opening fill structures 28 (if present) selective to the alternating stack (32, 46) of the insulating layers 32 and the electrically conductive layers 46. An isotropic etch process can be performed to etch the sacrificial fill material of the sacrificial connection via opening fill structures 28 selective to the alternating stack (32, 46) of the insulating layers 32 and the electrically conductive layers 46.

Figure 12:
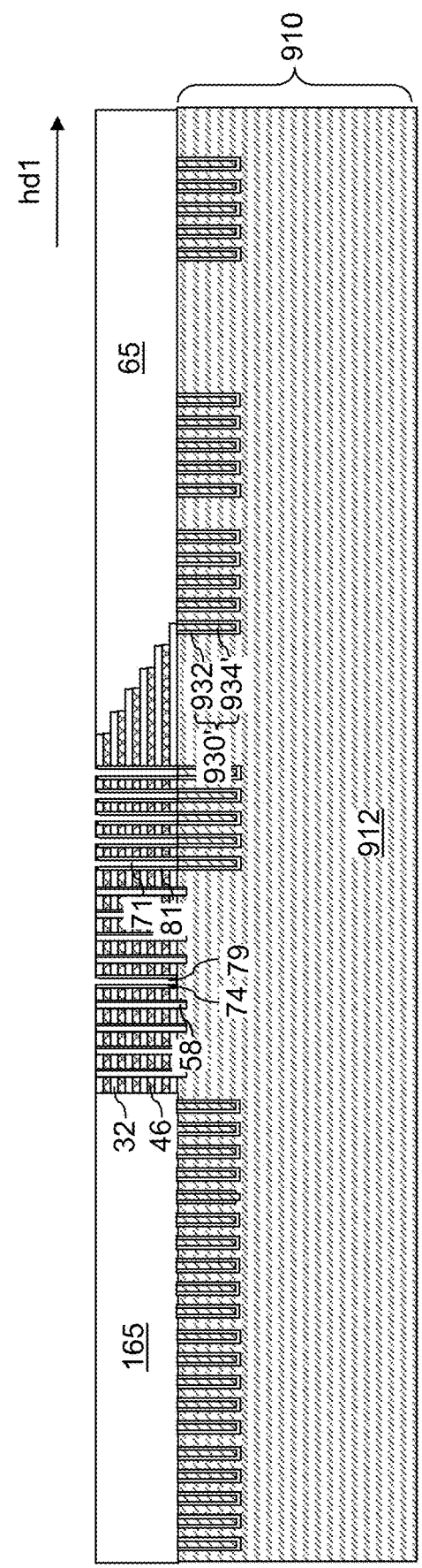
FIG. 12 is a vertical cross-sectional view of the first exemplary structure after formation of backside trench insulating spacers and through-stack insulating spacers according to the first embodiment of the present disclosure.

Referring to FIG. 12, a conformal insulating material layer including an insulating material can be deposited in the backside trenches 79 and the connection via cavities 71, and can be anisotropically etched to form insulating spacers (74, 81). The insulating spacers (74, 81) include backside trench insulating spacers 74 that are formed at peripheral portions of the backside trenches 79, and through-stack insulating spacers 81 that are formed at a peripheral portion of a respective one of the connection via cavities 71. The insulating spacers (74, 81) include an insulating material such as silicon oxide, silicon nitride, silicon oxynitride, and/or a dielectric metal oxide. The backside trench insulating spacers 74 and the through-stack insulating spacers 81 may have a same lateral thickness, which may be in a range from 10 nm to 100 nm, such as from 20 nm to 50 nm, although lesser and greater lateral thicknesses may also be employed. Source regions (not shown) may be formed at the bottom of each backside trench 79 by implantation of dopants of a second conductivity type, which is the opposite of the conductivity type. For example, if the conductivity type is p-type, the second conductivity type is n-type, and vice versa.

Referring to FIG. 13, at least one conductive material can be deposited in remaining volumes of the backside trenches 79 and the connection via cavities 71. The at least one conductive material can include, for example, a combination of a metallic barrier layer and a metallic fill material. The metallic barrier layer includes an electrically conductive metallic material that can function as a diffusion barrier layer and/or adhesion promotion layer for the metallic fill material. The metallic barrier layer can include a conductive metallic nitride material such as TIN, TaN, WN, or a stack thereof, or can include a conductive metallic carbide material such as TiC, TaC, WC, or a stack thereof. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum. Excess portions of the at least one conductive material can be removed from above the horizontal plane including the top surface of the alternating stack (32, 46) by a planarization process such as a chemical mechanical planarization process. Each remaining portion of the at least one conductive material filling a backside trench 79 constitutes a backside contact via structure 76, which can contact a top surface of a respective source region embedded in the semiconductor material layer 912. Each remaining portion of the at least one conductive material filling a respective connection via cavity 71 constitutes a laterally-isolated through-stack via structure 82. Each laterally-isolated through-stack via structure 82 can contact a top surface of an in-process laterally-isolated through-substrate via structure 934'. Each laterally-isolated through-stack via structure 82 is laterally surrounded by a respective through-stack insulating spacer 81. In one embodiment, each through-stack insulating spacer 81 can have a tubular configuration, and can contact a top surface of an in-process laterally-isolated through-substrate via structure 934' and/or a top surface of a substrate insulating spacer 932.

In an alternative embodiment, the connection via openings 29 (i.e., the connection via cavities 71) can be formed between the steps shown in FIG. 7 and FIG. 8. In other words, the connection via openings 29 (i.e., the connection via cavities 71) can be formed after forming the memory opening fill structures 58 and before to forming the backside trenches 79. Each laterally-isolated through-stack via structure 82 and respective through-stack insulating spacer 81 is then separately formed in each respective connection via opening 29 (i.e., connection via cavity 71) prior to forming the backside trenches 79 and prior to forming the backside trench insulating spacers 74 and the backside contact via structures 76 in the backside trenches 79.

Referring to FIG. 14, a contact-level dielectric layer 70 can be deposited over the alternating stack (32, 46), the stepped dielectric material portion 65, and the non-stepped dielectric material portion 165. The contact-level dielectric layer 70 includes a dielectric material such as silicon oxide. The thickness of the contact-level dielectric layer 70 can be in a range from 100 nm to 600 nm, although lesser and greater thicknesses can also be employed. A photoresist layer (not shown) can be applied over the contact-level dielectric layer 70, and can be lithographically patterned to form openings therein. The pattern of the openings in the photoresist layer can be transferred through the contact-level dielectric layer 70 by an anisotropic etch process to form various contact via cavities (83, 85, 187, 181). The contact via cavities (83, 85, 187, 181) can include through-dielectric via cavities 83 that vertically extend through the contact-level dielectric layer 70 and one of the stepped dielectric material portion 65 and the non-stepped dielectric material portion 165, and extending to a top surface of a respective in-process laterally-isolated through-substrate via structure 934'. The contact via cavities (83, 85, 187, 181) can include layer contact via cavities 85 that vertically extend through the contact-level dielectric layer 70 and the stepped dielectric material portion 65 and down to a top surface of a respective one of the electrically conductive layers 46. Further, the contact via cavities (83, 85, 187, 181) can include drain contact via cavities 187 that vertically extend through the contact-level dielectric layer 70 down to a top surface of a memory opening fill structure 58. A top surface of a drain region 63 can be physically exposed at the bottom of each drain contact via cavity 187. In addition, the contact via cavities (83, 85, 187, 181) can include contact-level connection cavities 181 that vertically extend through the contact-level dielectric layer 70 down to a top surface of a respective one of the laterally-isolated through-stack via structures 82.

Figure 15:
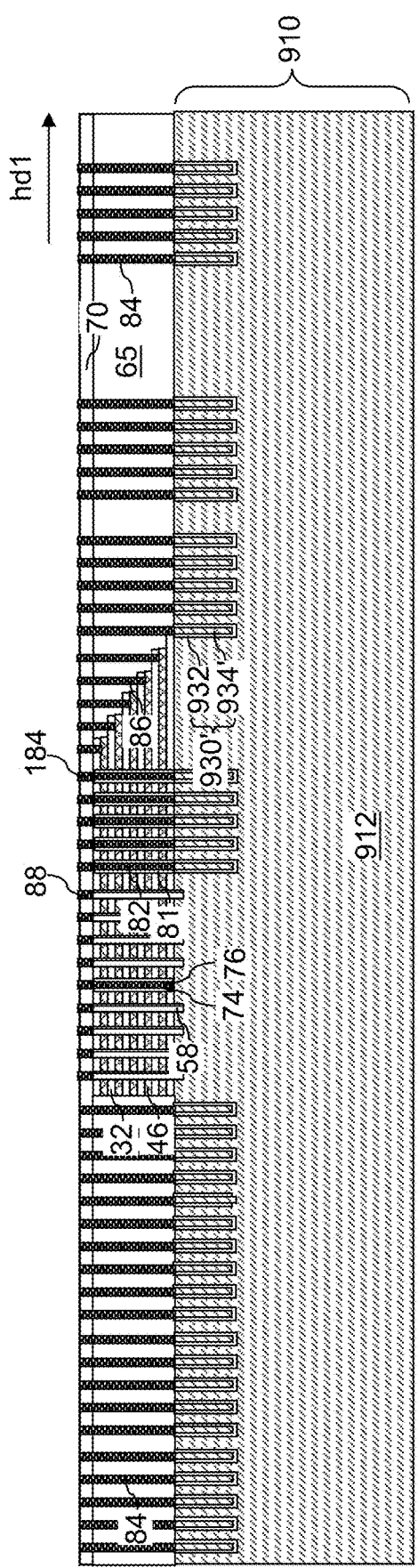
FIG. 15 is a vertical cross-sectional view of the first exemplary structure after formation of through-dielectric via structures, layer contact via structures, drain contact via structures, and connection via structures according to the first embodiment of the present disclosure.

Referring to FIG. 15, at least one conductive material can be deposited in the contact via cavities (83, 85, 187, 181). The at least one conductive material can include, for example, a combination of a metallic barrier layer and a metallic fill material. Excess portions of the at least one conductive material can be removed from above the horizontal plane including the top surface of the contact-level dielectric layer 70. Remaining portions of the at least one conductive material filling the contact via cavities (83, 85, 187, 181) constitute various contact via structures (84, 86, 88, 184).

The contact via structures (84, 86, 88, 184) include through-dielectric via structures 84 that fills a respective one of the through-dielectric via cavities 83, layer contact via structures 86 that fills a respective one of the layer contact via cavities 85, drain contact via structures 88 that fills a respective one of the drain contact via cavities 187, and connection via structures 184 that fills a respective one of the contact-level connection cavities 181. Each through-dielectric via structure 84 can contact a top surface of a respective in-process laterally-isolated through-substrate via structure 934' (if present) and a straight sidewall of one of the stepped dielectric material portion 65 and the non-stepped dielectric material portion 165. Each layer contact via structures 86 contacts a horizontal surface of a respective one of the electrically conductive layers 46 and contacts a straight sidewall of the stepped dielectric material portion 65. Each drain contact via structure 88 contacts a respective one of the drain regions 63. Each connection via structure 184 contacts a horizontal surface of a respective one of the laterally-isolated through-stack via structures 82.

Figure 16:
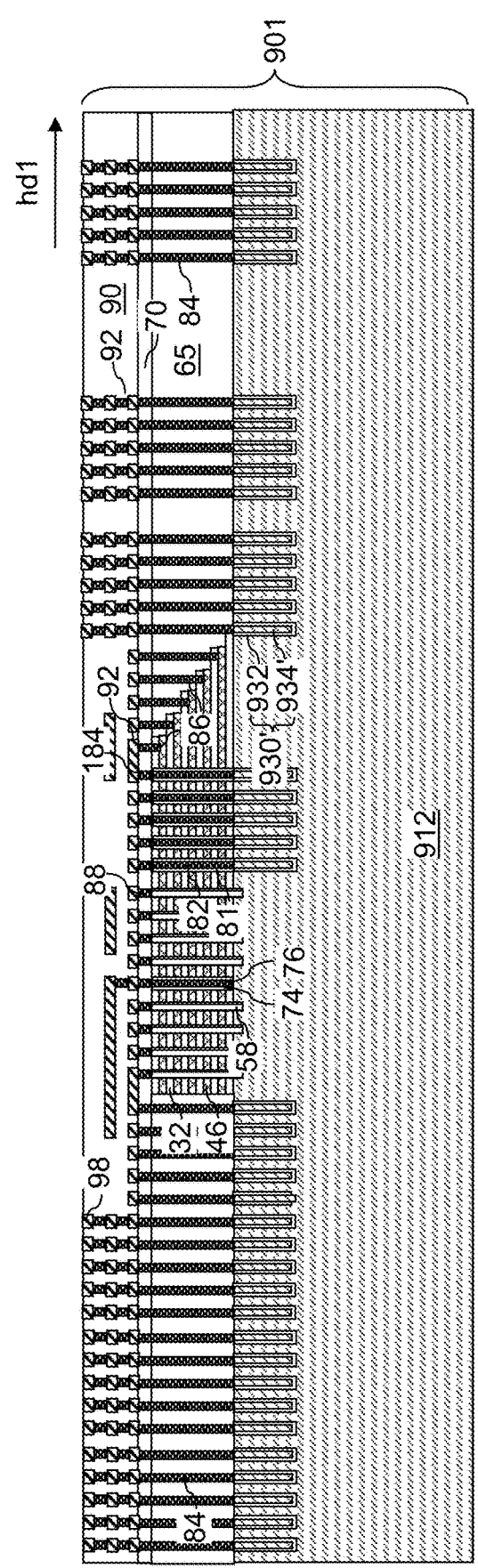
FIG. 16 is a vertical cross-sectional view of the first exemplary structure after formation of first metal interconnect structures and first interconnect-side bonding pads embedded in first dielectric material layers according to the first embodiment of the present disclosure.

Referring to FIG. 16, dielectric material layers 90 are formed over the contact-level dielectric layer 70. Metal interconnect structures 92 that are formed in the dielectric material layers 90. Metal bonding pads that are formed in the dielectric material layers 90 are herein referred to as interconnect-side bonding pads 98.

In one embodiment, each of laterally-isolated through-stack via structures 82 is electrically connected to a respective one of the layer contact via structures 86 by a respective electrically conductive path (184, 92) that includes at least one metal line embedded in dielectric material layers 90 located on the alternating stack (32, 46). Each electrically conductive path (184, 92) includes at least one metal line that is a component of the metal interconnect structures 92 and a connection via structure 184. In one embodiment, at least one electrically conductive path (184, 92) may include two or more metal lines and two or more metal via structures within the metal interconnect structures 92. In one embodiment, one of the laterally-isolated through-stack via structures 82 may be electrically connected to one of the layer contact via structures 86 by an electrically conductive path that consists of a metal line contacting a top surface of the one of the first layer contact via structures 82 and a connection via structure 184 contacting a bottom surface of the metal line and a top surface of the one of the laterally-isolated through-stack via structures 82.

The first exemplary structure includes a three-dimensional memory die. In order to distinguish the three-dimensional memory die in the first exemplary structure of FIG. 16 from additional three-dimensional memory dies to be subsequently employed, the three-dimensional memory die in the first exemplary structure of FIG. 16 is herein referred to as a first three-dimensional memory die 901. Each component of the first three-dimensional memory die is herein referred to as a respective first component. For example, the alternating stack of insulating layers 32 and electrically conductive layers 46 in the first three-dimensional memory die 901 is herein referred to as a first alternating stack of first insulating layers 32 and first electrically conductive layers 46. The through-dielectric via structures 84 in the first three-dimensional memory die 901 are herein referred to as first through-dielectric via structures 84. The layer contact via structures 86 in the first three-dimensional memory die 901 are herein referred to as first layer contact via structures 86. The drain contact via structures 88 in the first three-dimensional memory die 901 are herein referred to as first drain contact via structures 88. The connection via structures 184 in the first three-dimensional memory die 901 are herein referred to as first contact via structures 184. The stepped dielectric material portion 65 in the first three-dimensional memory die 901 is herein referred to as a first stepped dielectric material portion 65. The non-stepped dielectric material portion 165 in the first three-dimensional memory die 901 is herein referred to as a first non-stepped dielectric material portion 165. The dielectric material layers 90 in the first three-dimensional memory die 901 are herein referred to as first dielectric material layers 90. The metal interconnect structures 92 in the first dielectric material layers 90 are herein referred to as first metal interconnect structures 92. The interconnect-side bonding pads 98 located in the first dielectric material layers 90 are herein referred to as first interconnect-side bonding pads 98, etc.

Figure 17:
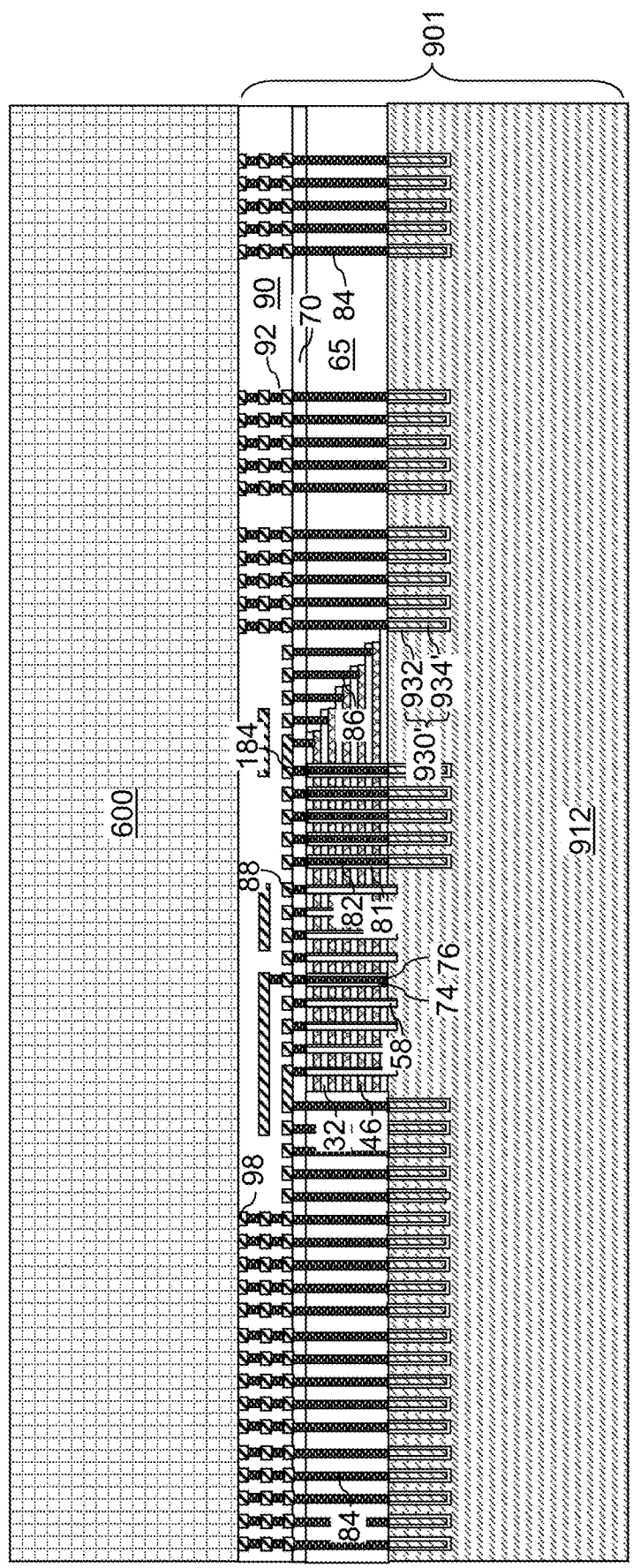
FIG. 17 is a vertical cross-sectional view of the first exemplary structure after attaching a handle substrate to an interconnect side of a first three-dimensional memory die according to the first embodiment of the present disclosure.

Referring to FIG. 17, a handle substrate 600 can be attached to the side of the three-dimensional memory die 901 that includes the first interconnect-side bonding pads 98. The handle substrate 600 includes a material, such as metal, plastic, semiconductor, ceramic or glass that can provide sufficient mechanical support to the three-dimensional memory die including the substrate 910. The thickness of the handle substrate 600 can be in a range from 200 microns to 2 mm, although lesser and greater thicknesses can also be employed. Optionally, an adhesive layer (such as a thermally decomposable adhesive material layer or an ultraviolet deactivated adhesive material layer) can be employed to attach the handle substrate 600 to the first three-dimensional memory die 901.

Figure 18:
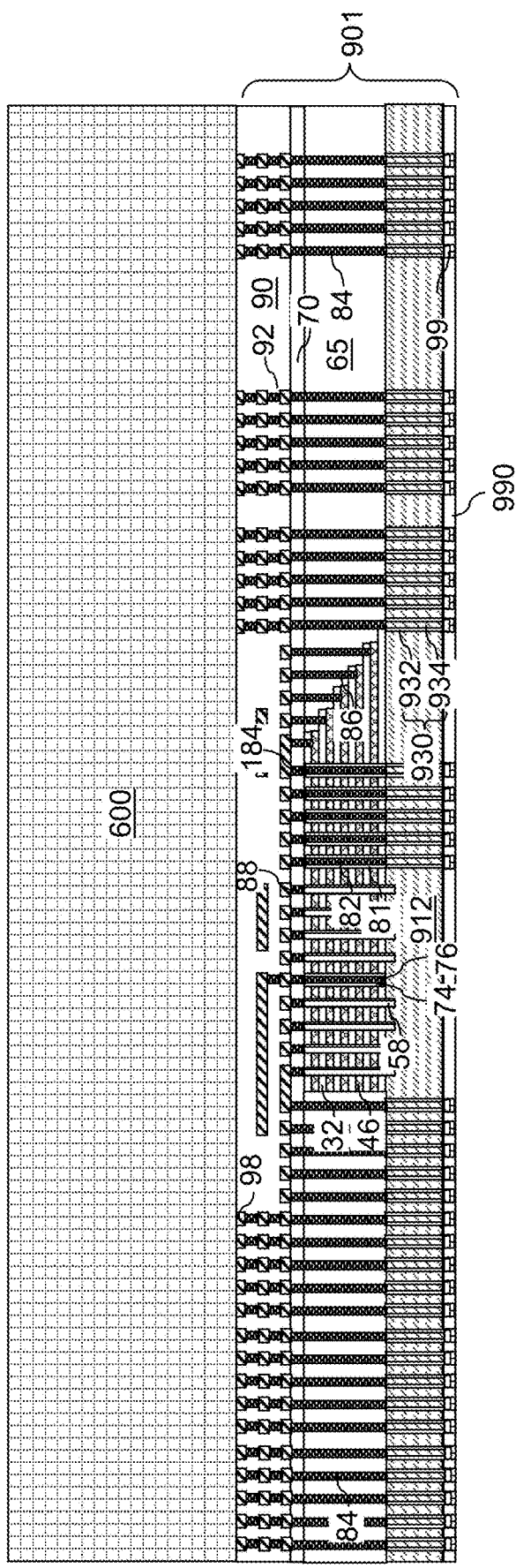
FIG. 18 is a vertical cross-sectional view of the first exemplary structure after thinning the first substrate from the backside, and formation of first substrate-side bonding pads embedded in first backside insulating layer according to the first embodiment of the present disclosure.

Referring to FIG. 18, the backside of the first substrate 910 (which may include the backside of the first semiconductor material layer 912) can be thinned, for example, by grinding, polishing, an isotropic etch process (such as a wet etch process), and/or an anisotropic etch process (such as a reactive ion etch process). The thinning of the first substrate 910 can continue until surfaces of the in-process laterally-isolated through-substrate via structures 934' (if present) are physically exposed. Upon thinning of the first substrate 910, the in-process laterally-isolated through-substrate via structures 934' vertically extend through the entire thickness of the first substrate 910, and are herein referred to as laterally-isolated through-substrate via structures 934. Each laterally-isolated through-substrate via structure 934 can be laterally surrounded by a respective substrate insulating spacer 932. Each contiguous combination of a substrate insulating spacer 932 and a laterally-isolated through-substrate via structure 934 constitutes a through-substrate connection structure 930.

In an alternative embodiment, through-substrate connection structures 930 can be formed after the first substrate 910 thinning step shown in FIG. 18. Specifically, the deep trenches can be formed through the remaining part of the thinned first substrate 910 until the respective via structures (82, 84) are exposed in the deep trenches. The deep trenches are then filled with the combination of the substrate insulating spacer 932 and the laterally-isolated through-substrate via structure 934 which contacts a respective via structure (82, 84).

A first backside insulating layer 990 can be deposited on the backside surface of the first substrate 910 as thinned by the thinning process. The first backside insulating layer 990 includes an insulating material such as silicon oxide, and can have a thickness in a range from 500 nm to 5 microns. First substrate-side bonding pads 99 can be formed in a first backside insulating layer 990 such that each first substrate-side bonding pad 99 contacts a horizontal surface of a respective one of the laterally-isolated through-substrate via structures 934. Thus, each first substrate-side bonding pad 99 is located on the backside of the first substrate 910, and is electrically connected to a respective one of the first laterally-isolated through-substrate via structures 934.

A first three-dimensional memory die 901 is provided, which includes a first alternating stack of first insulating layers 32 and first electrically conductive layers 46 located on a front side of a first substrate 910. The first three-dimensional memory die 901 includes first memory structures (e.g., first memory stack structures 55 which are part of the first memory opening fill structures 58) located in the first alternating stack (32, 46), a first stepped dielectric material portion 65 contacting stepped surfaces of the first alternating stack (32, 46), first layer contact via structures 86 vertically extending through the first stepped dielectric material portion 65 and contacting a respective one of the first electrically conductive layers 46, first laterally-isolated through-stack via structures 82 vertically extending through a region of the first alternating stack (32, 46) in which each layer of the first alternating stack (32, 46) is present and electrically connected to a respective one of the first layer contact via structures 86, first laterally-isolated through-substrate via structures 934 electrically connected to a respective one of the first laterally-isolated through-stack via structures 82, and first substrate-side bonding pads 99 embedded in a first backside insulating layer 990 located on a backside of the first substrate 910 and electrically connected to a respective one of the first laterally-isolated through-substrate via structures 934. In one embodiment, the first substrate 910 comprises a semiconductor material layer 912 in electrical contact with a bottom end of each of the vertical semiconductor channels 60 in the first memory opening fill structures 58, and each of the first laterally-isolated through-substrate via structures 934 can be laterally surrounded by a respective substrate insulating spacer 932 that contacts a sidewall of the semiconductor material layer 912.

Figure 19:
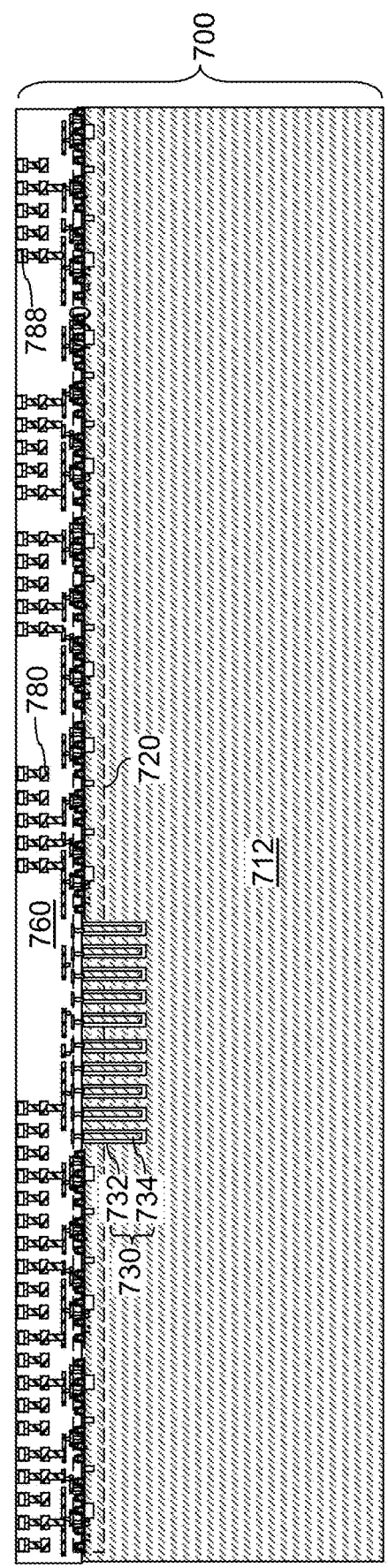
FIG. 19 is a vertical cross-sectional view of a logic die according to the first embodiment of the present disclosure.

Referring to FIG. 19, a logic die 700 according to an embodiment of the present disclosure is illustrated. In this embodiment, the logic die 700 is formed on a different substrate from the memory die 901. In alternative embodiments described below, the logic die 700 may be formed on the same substrate as the first memory die 901. The logic die 700 includes driver circuit devices, such as complementary metal oxide semiconductor (CMOS) transistors 720 located on a logic substrate including a logic-die semiconductor material layer 712. The logic substrate may comprise a silicon wafer or a silicon-on-insulator wafer, and the logic-die semiconductor material layer 712 may comprise a doped well in the top part of the logic substrate and/or an epitaxial semiconductor layer located on the logic substrate. In one embodiment, optional logic-die through-substrate connection structures 730 can be formed in an upper portion of the logic substrate. Each logic-die through-substrate connection structure 730 can include a logic-die laterally-isolated through-substrate via structure 734 and a logic-die substrate insulating spacer 732 that surrounds the logic-die laterally-isolated through-substrate via structure 734. Logic-die dielectric material layers 760 can be formed over the CMOS transistors 720, and logic-die metal interconnect structures 780 can be embedded in the logic-die dielectric material layers 760. Logic-die bonding pads 788 can be embedded in the uppermost level of the logic-die dielectric material layers 780. The logic-die bonding pads 788 are electrically connected to a respective node (e.g., source, drain or gate) of the CMOS transistors 720. The pattern of the logic-die bonding pads 788 can be a mirror image pattern of the pattern of the first substrate-side bonding pads 99 of the first three-dimensional memory die 901, or to the first interconnect-side bonding pads 98 of the first three-dimensional memory die 901.

Figure 20:
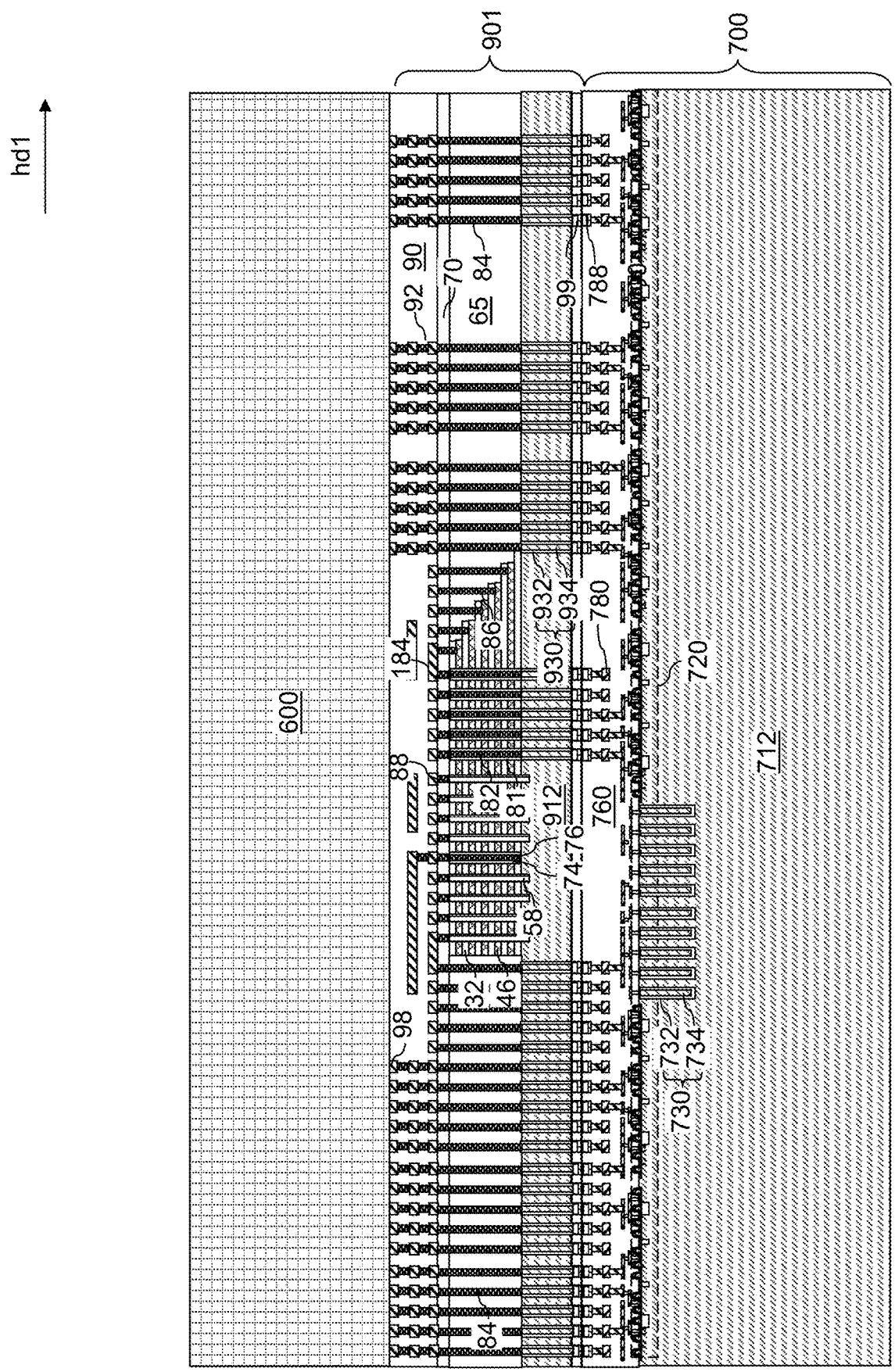
FIG. 20 is a vertical cross-sectional view of the first exemplary structure after attaching the logic die to the substrate side of the first three-dimensional memory die according to the first embodiment of the present disclosure.

Referring to FIG. 20, the logic die 700 can be bonded to the first three-dimensional memory die 901. In one embodiment, the pattern of the logic-die bonding pads 788 can be a mirror image pattern of the pattern of the first substrate-side bonding pads 99 of the first three-dimensional memory die 901, and the logic die 700 can be attached to the substrate side of the first three-dimensional memory die 901 by bonding the logic-die bonding pads 788 to the first substrate-side bonding pads 99 of the first three-dimensional memory die 901. Metal-to-metal bonding (such as copper to copper bonding) or hybrid bonding (such as metal to metal and dielectric to dielectric bonding) can be employed to bond the logic-die bonding pads 788 to the first substrate-side bonding pads 99 of the first three-dimensional memory die 901. The first three-dimensional memory die 901 can be attached directly to the logic die 700.

Figure 21:
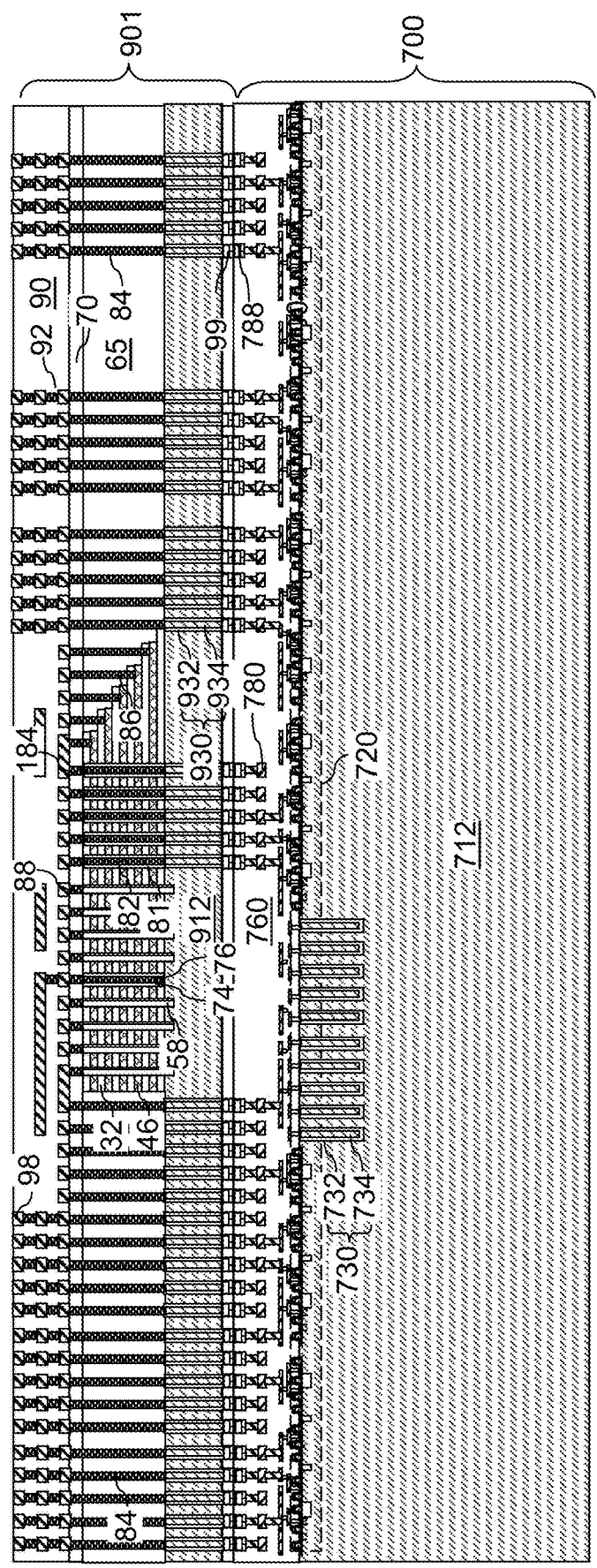
FIG. 21 is a vertical cross-sectional view of the first exemplary structure after removal of the handle substrate.

Referring to FIG. 21, the handle substrate 600 can be detached from the bonded assembly of the logic die 700 and the first three-dimensional memory die 901.

Figure 22:
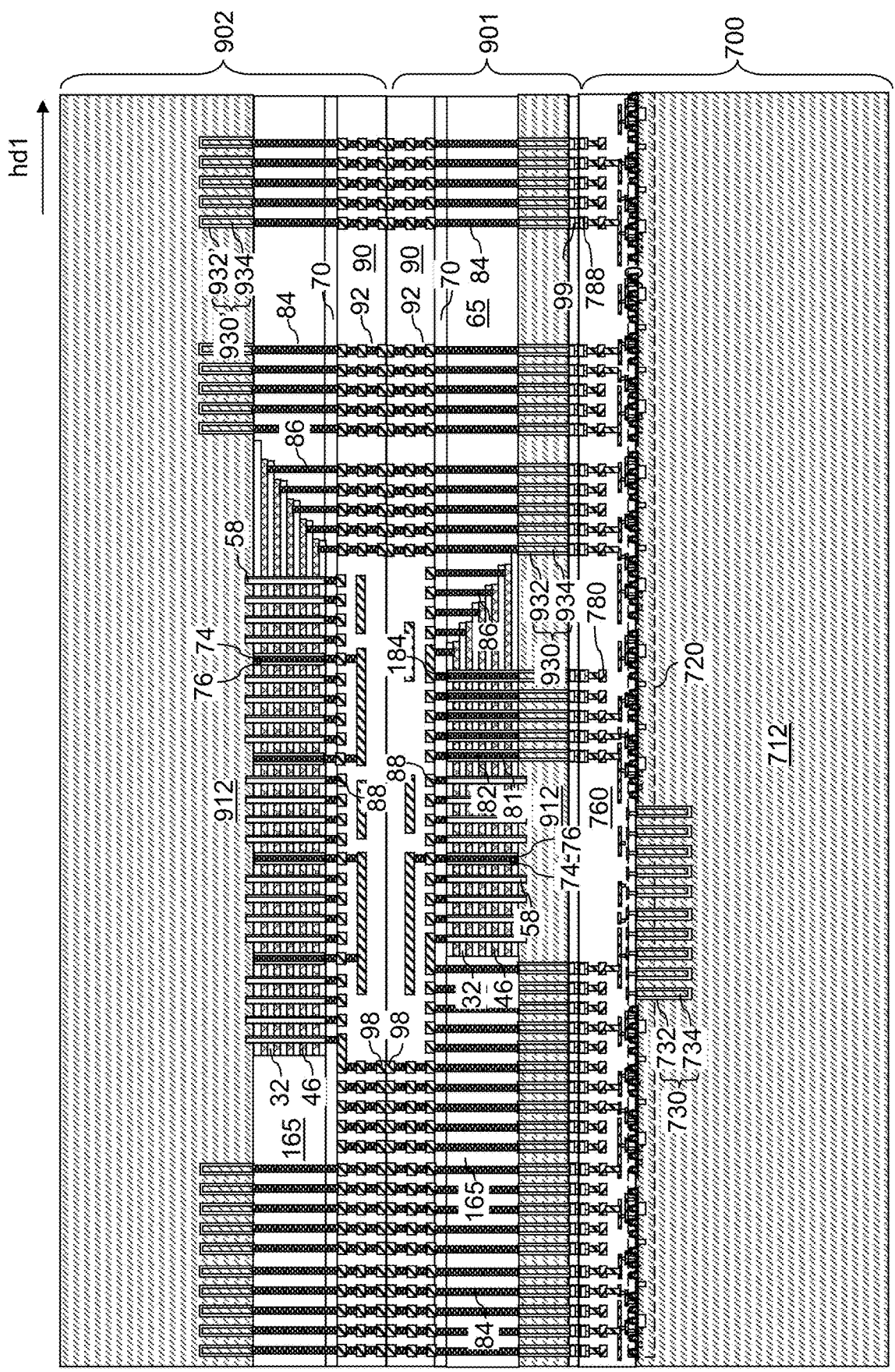
FIG. 22 is a vertical cross-sectional view of the first exemplary structure after attaching a second three-dimensional memory die according to the first embodiment of the present disclosure.

Referring to FIG. 22, a second three-dimensional memory die 902 is provided, which can be formed employing the same set of processing steps as the first three-dimensional memory die 901 with suitable changes in the lithographic pattern during the manufacturing steps. The components of the second three-dimensional memory die 902 are herein referred to as second components. In one embodiment, the pattern of the second interconnect-side bonding pad 98 in the second three-dimensional memory die 902 can be the mirror image pattern of the first interconnect-side bonding pad 98 in the first three-dimensional memory die 901. In one embodiment, formation of connection via openings 29, the connection via opening fill structures 28, through-stack insulating spacers 81, laterally-isolated through-stack via structure 82, and connection via structures 184 can be omitted during manufacture of the second three-dimensional memory die 902. In this case, each second electrically conductive layer 46 can be electrically connected to a respective one of the second interconnect-side bonding pads 98 through a respective second layer contact via structure 86 and a respective subset of the second metal interconnect structures 92 that are embedded in the second dielectric material layers 90 of the second three-dimensional memory die 902.

In one embodiment, the first electrically conductive layers 46 in the first three-dimensional memory die 901 can have different lateral extents along the first horizontal direction hd1 (e.g., word line direction) that decrease with a respective vertical distance from the logic die 700, and the second electrically conductive layers 46 in the second three-dimensional memory die 902 can have different lateral extents along the first horizontal direction hd1 that increase with a respective vertical distance from the logic die 700. Furthermore, the second terrace region 300 of the second three-dimensional memory die 902 can be laterally offset along the first horizontal direction hd1 from the first terrace region 300 of the first three-dimensional memory die 901. For example, all second electrically conductive layers 46 in the second terrace region 300 of the second three-dimensional memory die 902 can extend past the bottom (e.g., longest) first electrically conductive layer 46 in the first terrace region 300 of the first three-dimensional memory device 901 along the first horizontal direction hd1.

Figure 23:
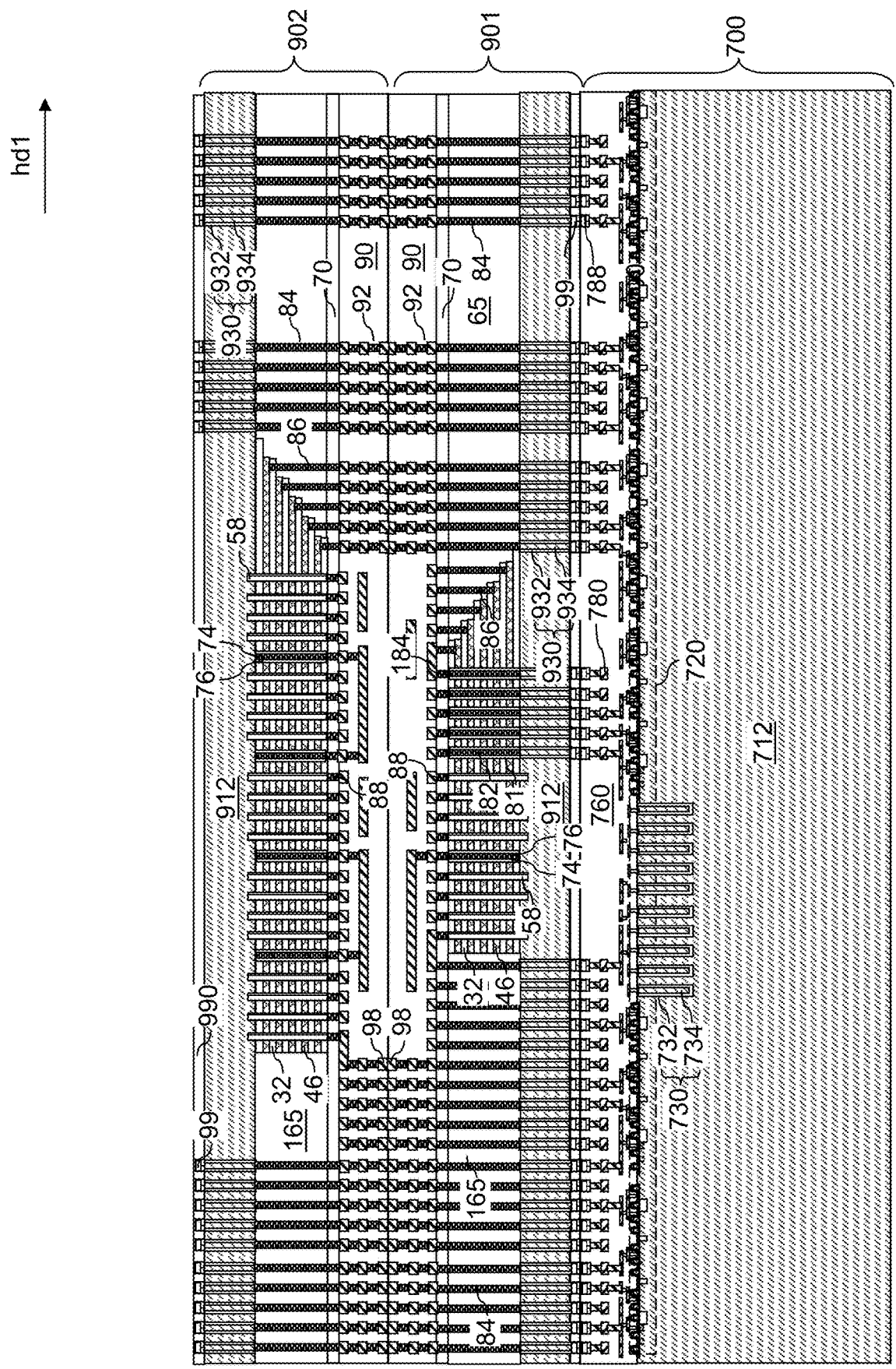
FIG. 23 is a vertical cross-sectional view of the first exemplary structure after thinning the backside of the second three-dimensional memory device and formation of second substrate-side bonding pads according to the first embodiment of the present disclosure.

Referring to FIG. 23, the processing steps of FIG. 18 can be performed with any suitable changes to thin the backside of the second substrate 910, and to form a second backside insulating layer 990 embedding second substrate-side bonding pads 99 that contact a respective second through-substrate connection structure 930. Each second through-substrate connection structure 930 includes a respective contiguous combination of a second substrate insulating spacer 932 and a second laterally-isolated through-substrate via structure 934. Each second laterally-isolated through-substrate via structure 934 can contact a respective through-dielectric via structure 84. The horizontal surfaces within the stepped surfaces of the first terrace region 300 of the first three-dimensional memory die 901 can face away from the logic die 700, and the horizontal surfaces within the stepped surfaces of the second terrace region 300 of the second three-dimensional memory die 902 can face toward the logic die 700.

Figure 24:
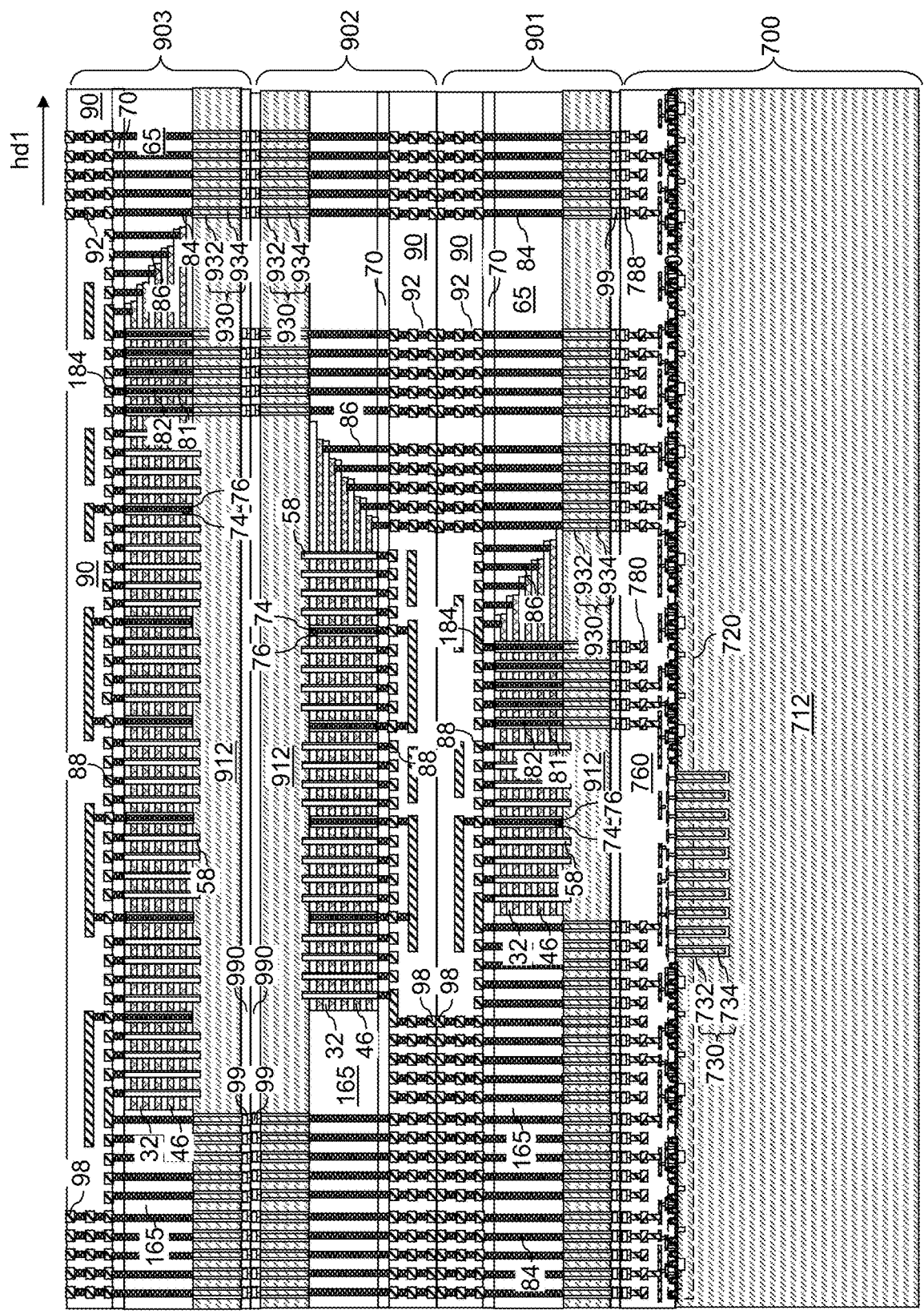
FIG. 24 is a vertical cross-sectional view of the first exemplary structure after attaching a third three-dimensional memory device to the second three-dimensional memory device according to the first embodiment of the present disclosure.

Referring to FIG. 24, an optional third three-dimensional memory die 903 can be provided, which can be formed employing the same set of processing steps as the first three-dimensional memory die 901 with suitable changes in the lithographic pattern during the manufacturing steps. The components of the third three-dimensional memory die 903 are herein referred to as third components. In one embodiment, the pattern of the third substrate-side bonding pads 99 in the third three-dimensional memory die 903 can be the mirror image pattern of the second substrate-side bonding pads 99 in the second three-dimensional memory die 902. In one embodiment, the third three-dimensional memory die 903 can include third through-stack insulating spacers 81, third laterally-isolated through-stack via structure 82, and third connection via structures 184. In this case, each third electrically conductive layer 46 can be electrically connected to a respective third connection via structure 184 through a respective third layer contact via structure 86, a respective subset of the third metal interconnect structures 92 embedded in the third dielectric material layers 90, and a respective third connection via structure 184. Further, each third connection via structure 184 can be electrically connected to a respect one of the third substrate-side bonding pads 99 through a respective laterally-isolated through-substrate via structure 934.

Generally, the third three-dimensional memory die 903 comprises a third alternating stack of third insulating layers 32 and third electrically conductive layers 46 located on a front side of a third substrate 910. The third electrically conductive layers 46 in the third three-dimensional memory die 903 have different lateral extents along the first horizontal direction hd1 that increases or decreases with a respective vertical distance from the logic die 700. In one embodiment, the lateral extent of the third electrically conductive layers 46 in the third three-dimensional memory die 903 decreases with a respective vertical distance from the logic die 700. The third three-dimensional memory die 903 comprises third memory structures (e.g., memory stack structures 55) located in the third alternating stack (32, 46).

Furthermore, the second terrace region 300 of the third three-dimensional memory die 903 can be laterally offset along the first horizontal direction hd1 from the first and second terrace regions 300 of the first and second three-dimensional memory dies (901, 902). For example, all second electrically conductive layers 46 in the third terrace region 300 of the third three-dimensional memory die 903 can extend past the top (e.g., longest) second electrically conductive layer 46 in the second terrace region 300 of the second three-dimensional memory device 902 along the first horizontal direction hd1.

The third three-dimensional memory die 903 comprises third layer contact via structures 86 contacting a respective one of the third electrically conductive layers 46 and electrically connected to a respective third bonding pad (such as a respective third substrate-side bonding pad 99) that is bonded to a respective second bonding pad (such as a respective second substrate-side bonding pads 99) within the second three-dimensional memory die 902.

Figure 25:
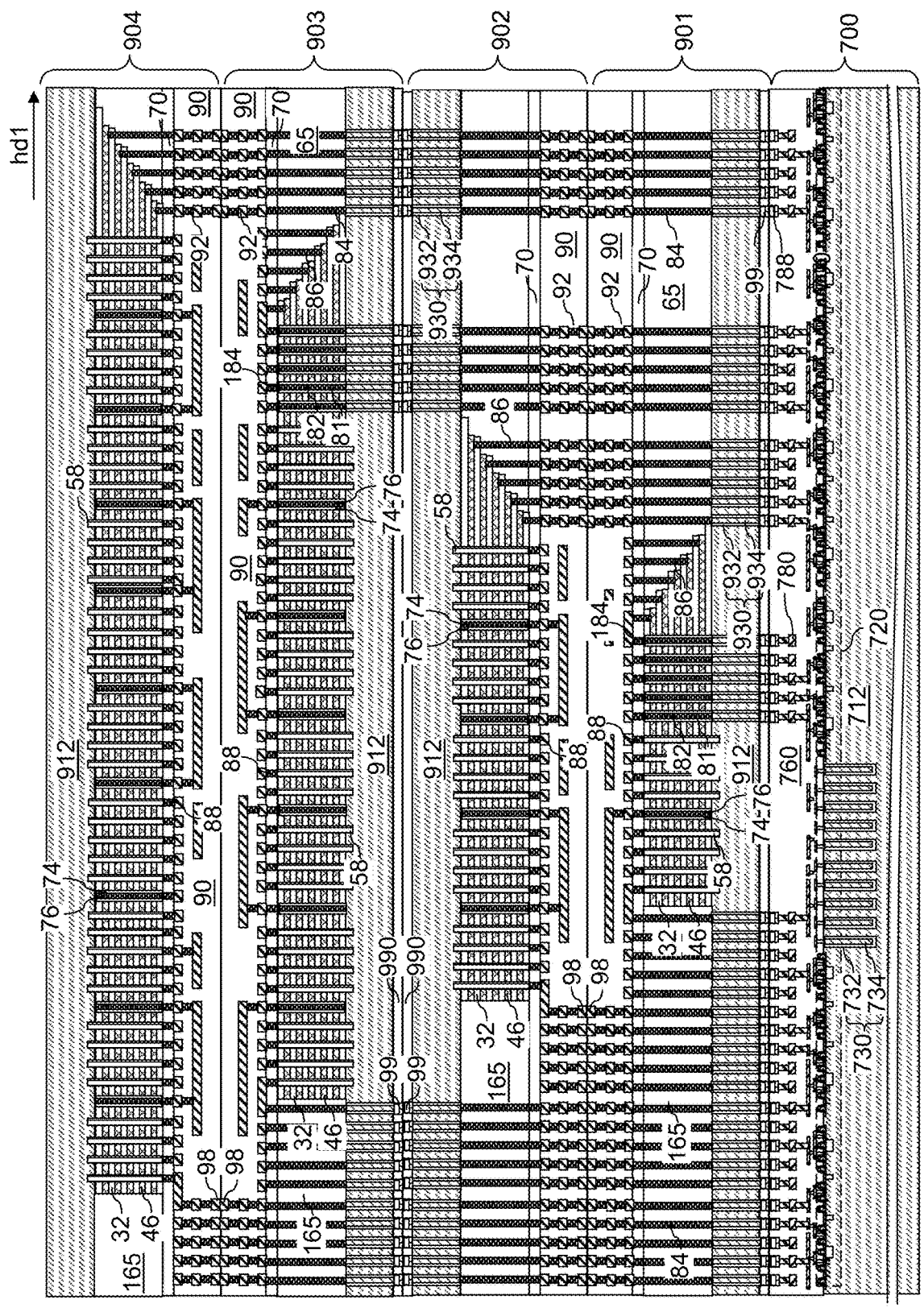
FIG. 25 is a vertical cross-sectional view of the first exemplary structure after attaching a fourth three-dimensional memory device to the third three-dimensional memory device according to the first embodiment of the present disclosure.

Referring to FIG. 25, an optional fourth three-dimensional memory die 904 is provided, which can be formed employing the same set of processing steps as the second three-dimensional memory die 902 with suitable changes in the lithographic pattern during the manufacturing steps. The components of the fourth three-dimensional memory die 904 are herein referred to as fourth components. In one embodiment, the pattern of the fourth interconnect-side bonding pad 98 in the fourth three-dimensional memory die 904 can be the mirror image pattern of the third interconnect-side bonding pad 98 in the third three-dimensional memory die 903. In one embodiment, formation of connection via openings 29, connection via opening fill structures 28, through-stack insulating spacers 81, laterally-isolated through-stack via structure 82, and connection via structures 184 can be omitted during manufacture of the fourth three-dimensional memory die 904. In this case, each fourth electrically conductive layer 46 can be electrically connected to a respective one of the fourth interconnect-side bonding pads 98 through a respective fourth layer contact via structure 86 and a respective subset of the fourth metal interconnect structures 92 that are embedded in the fourth dielectric material layers 90 of the fourth three-dimensional memory die 904.

The fourth electrically conductive layers 46 in the fourth three-dimensional memory die 904 have different lateral extents along the first horizontal direction hd1 that increases or decreases with a respective vertical distance from the logic die 700. In one embodiment, the third electrically conductive layers 46 in the third three-dimensional memory die 903 decreases with a respective vertical distance from the logic die 700, and the fourth electrically conductive layers 46 in the fourth three-dimensional memory die 904 increases with a respective vertical distance from the logic die 700. The horizontal surfaces within the stepped surfaces of the third three-dimensional memory die 903 can face away from the logic die 700, and the horizontal surfaces within the stepped surfaces of the fourth three-dimensional memory die 904 can face toward the logic die 700.

Figure 26:
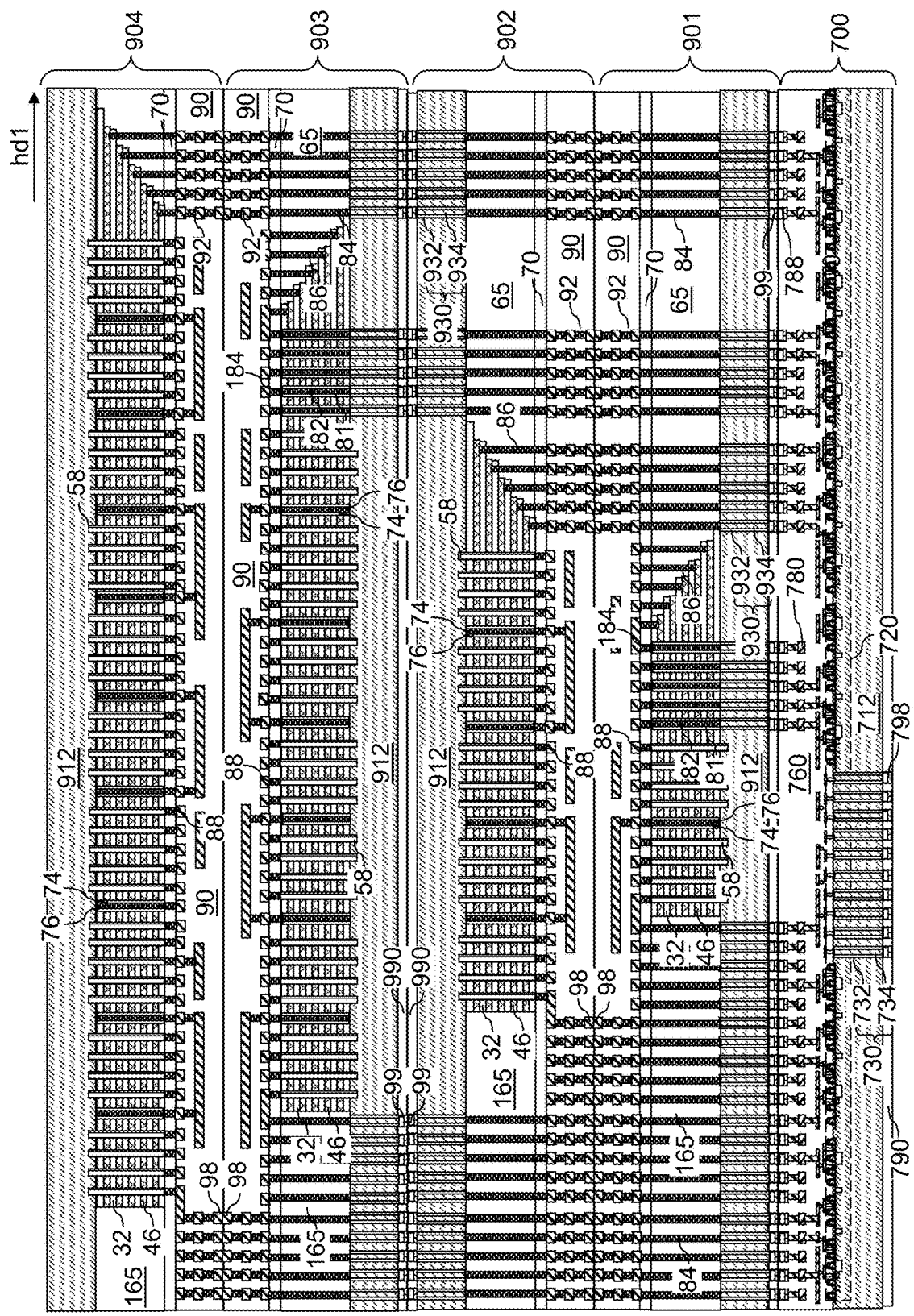
FIG. 26 is a vertical cross-sectional view of the first exemplary structure after thinning the substrate of the logic die and formation of logic-die backside bonding pads according to the first embodiment of the present disclosure.

Referring to FIG. 26, the backside of the logic-die substrate, such as the backside of the logic-die semiconductor material layer 712, can be thinned by grinding, polishing, an isotropic etch process, or an anisotropic etch process. The backside of the logic-die semiconductor material layer 712 can be thinned until surfaces of the logic-die laterally-isolated through-substrate via structures 734 are physically exposed. Logic-die through-substrate connection structures 730 can vertically extend through the logic-die substrate, which may include the logic-die semiconductor material layer 712 as thinned by the thinning process. Each logic-die through-substrate connection structure 730 can include a logic-die laterally-isolated through-substrate via structure 734 and a logic-die substrate insulating spacer 732. Alternatively, the logic-die through-substrate connection structures 730 can be formed after thinning the logic-die semiconductor material layer 712.

A logic-die backside insulating layer 790 can be formed on the backside of the logic-die substrate, and logic-die backside bonding pads 798 can be formed in the logic-die backside insulating layer 790. Each logic-die backside bonding pads 798 can be formed directly on a respective one of the logic-die laterally-isolated through-substrate via structure 734. The logic-die backside bonding pads 798 can be subsequently employed to mount the bonded assembly including the logic die 700 and the three-dimensional memory dies (901, 902, 903, 904) to a printed circuit board, to another semiconductor die, to an interposer, or to a package substrate. For example, the logic-die backside bonding pads 798 may be employed to provide wire bonding or C4 bonding.

Figure 27:
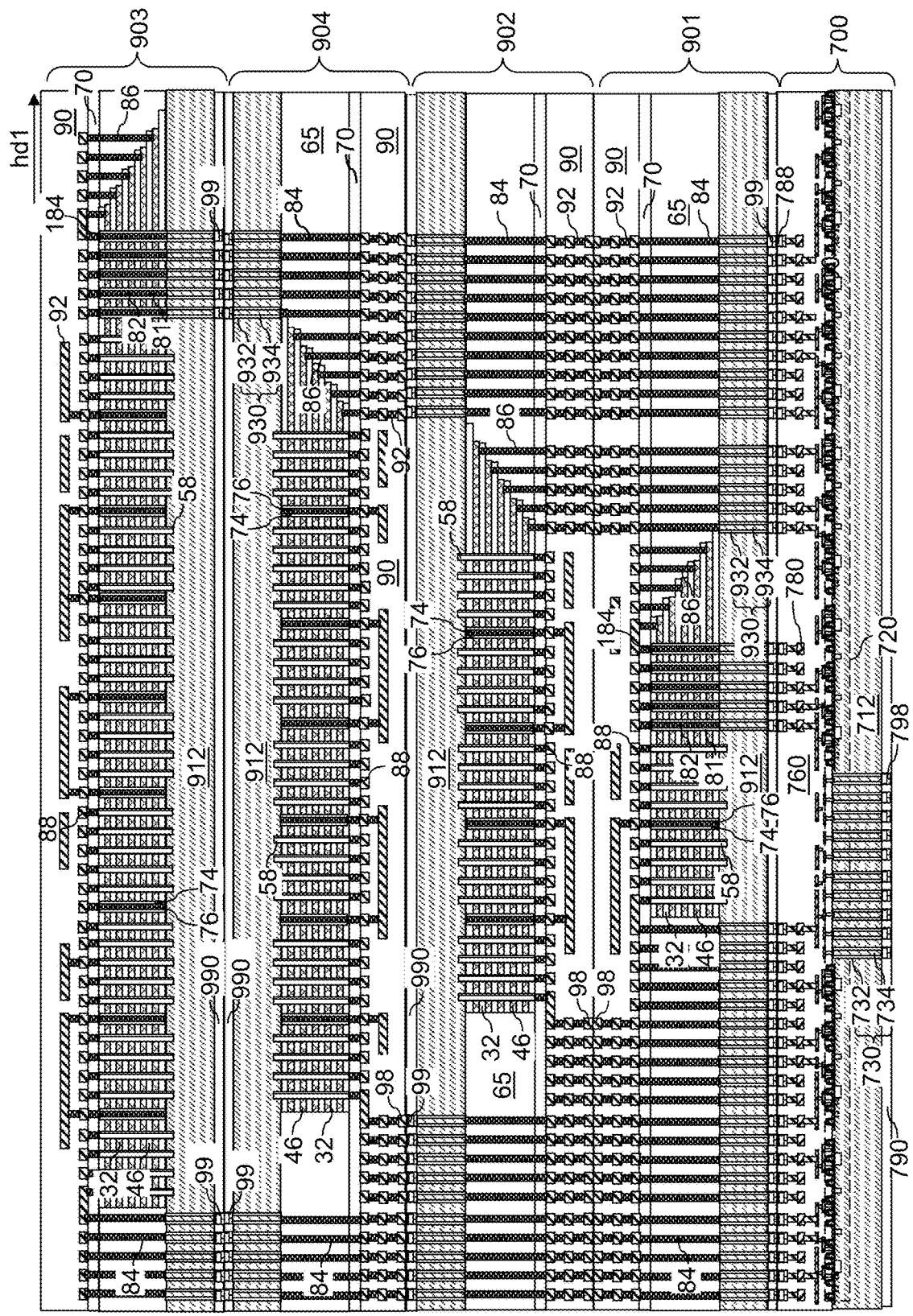
FIG. 27 is a vertical cross-sectional view of an alternative embodiment of the first exemplary structure according to the first embodiment of the present disclosure.

Referring to FIG. 27, a first alternative embodiment of the first exemplary structure according to an embodiment of the present disclosure can be derived from the first exemplary structure by attaching a fourth three-dimensional memory die 904 without any laterally-isolated through-stack via structure 82 to the second three-dimensional memory die 902, and by subsequently attaching a third three-dimensional memory die 903 to the fourth three-dimensional memory die 904. The third three-dimensional memory die 903 includes third through-stack insulating spacers 81, third laterally-isolated through-stack via structure 82, and third connection via structures 184.

The fourth electrically conductive layers 46 in the fourth three-dimensional memory die 904 have different lateral extents along the first horizontal direction hd1 that increases or decreases with a respective vertical distance from the logic die 700. In one embodiment, the fourth electrically conductive layers 46 in the fourth three-dimensional memory die 904 increases with a respective vertical distance from the logic die 700, and the third electrically conductive layers 46 in the third three-dimensional memory die 903 decreases with a respective vertical distance from the logic die 700.

It is understood that the ordinals "third" and "fourth" in the third three-dimensional memory die 903 and the fourth three-dimensional memory die 904 may be exchanged by counting the three-dimensional memory dies from bottom up. For example, if the third three-dimensional memory die as counted from the side of the logic die 700 is viewed as a "third" three-dimensional memory die, such as "third" three-dimensional memory die corresponds to the fourth three-dimensional memory die 904 illustrated in FIG. 27. Comparing the configurations illustrated in FIGS. 26 and 27, a "third" three-dimensional memory die that is attached directly to the second three-dimensional memory die 902 may be a third three-dimensional memory die 903 in which the lateral extents of electrically conductive layers 46 decrease with a respective vertical distance from the logic die 700 as illustrated in FIG. 26, or may be a fourth three-dimensional memory die 904 in which the lateral extents of electrically conductive layers 46 increase with a respective vertical distance from the logic die 700 as illustrated in FIG. 27.

The horizontal surfaces within the stepped surfaces of the first three-dimensional memory die 901 can face away from the logic die 700, and the horizontal surfaces within the stepped surfaces of the second three-dimensional memory die 902 can face toward the logic die 700. The horizontal surfaces within the stepped surfaces of the third three-dimensional memory die 903 can face away from the logic die 700, and the horizontal surfaces within the stepped surfaces of the fourth three-dimensional memory die 904 can face toward the logic die 700.

Figure 28:
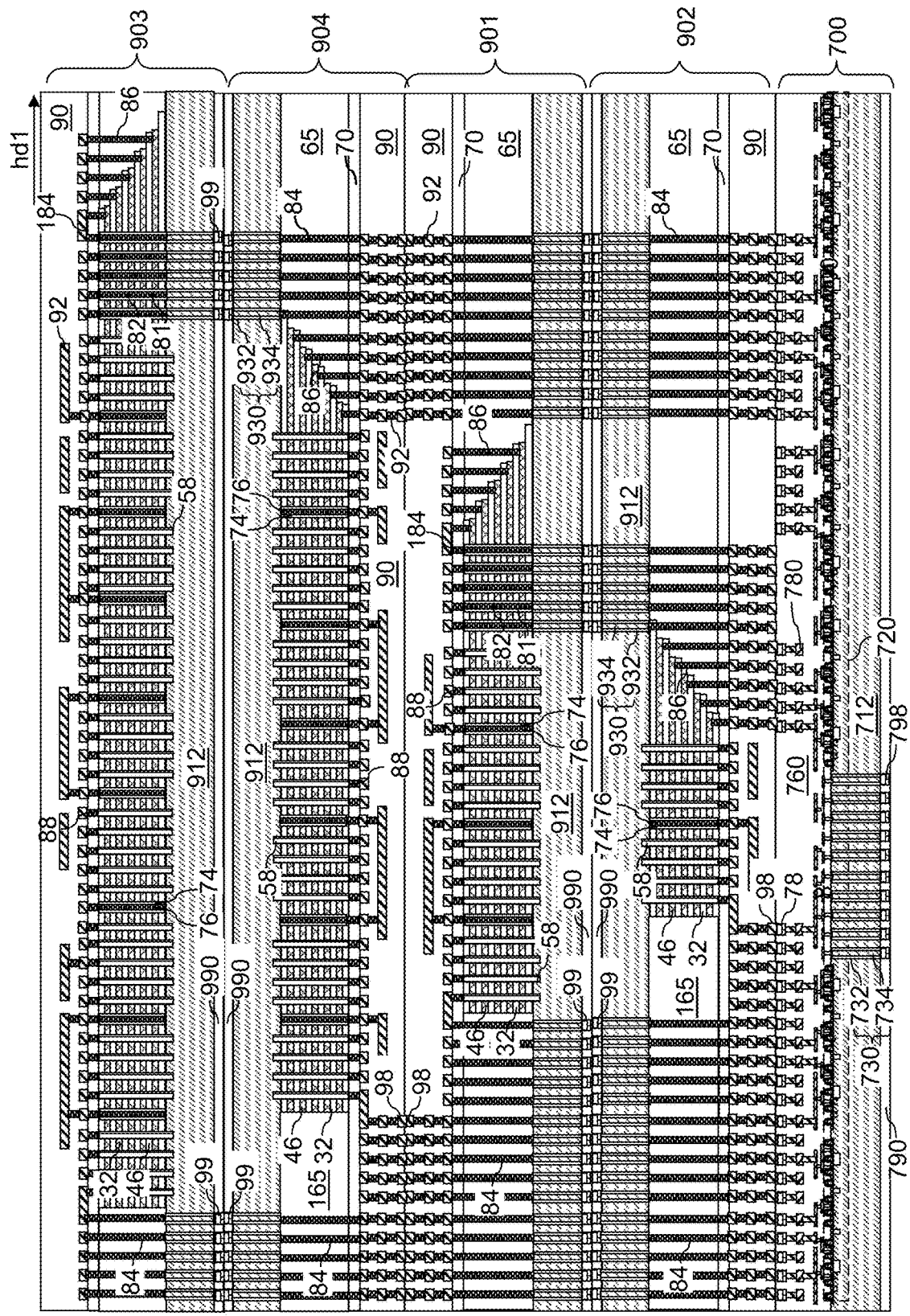
FIG. 28 is vertical cross-sectional view of a second exemplary structure according to a second embodiment of the present disclosure.

Referring to FIG. 28, a second exemplary structure according to a second embodiment of the present disclosure can be derived from the first exemplary structure by bonding a second three-dimensional memory die 902 that does not include through-stack insulating spacers 81, laterally-isolated through-stack via structure 82, or connection via structures 184 directly to the logic die 700. The first three-dimensional memory die 901 including the first through-stack insulating spacers 81, the first laterally-isolated through-stack via structure 82, and the first connection via structures 184 can be subsequently bonded to the second three-dimensional memory die 902. A handle substrate described above may be used to support the top of the first three-dimensional memory die 901 during thinning of the first substrate 910 of the die 901 and during bonding of the substrate 910 side of die 901 to the substrate 910 side of die 902. In this case, the first three-dimensional memory die 901 is attached to the logic die 700 indirectly through an intervening die, which is the second three-dimensional memory die 902. The first substrate-side bonding pads 99 can be electrically connected to the logic-die bonding pads 788 through electrically conductive paths located within the intervening die, i.e., the second three-dimensional memory die 902.

In one embodiment, the second three-dimensional memory die 902 can include a second alternating stack of second insulating layers 32 and second electrically conductive layers 46 located on a front side of a second substrate 910, second memory structures (e.g., second memory stack structures 55) located in the second alternating stack (32, 46), and second substrate-side bonding pads 99 embedded in a second backside insulating layer 990 located on a backside of the second substrate 910 and bonded to a respective one of the first substrate-side bonding pads 99.

In one embodiment, the first electrically conductive layers 46 can have different lateral extents along a first horizontal direction hd1 that decrease with a respective vertical distance from the logic die 700, and the second electrically conductive layers 46 can have different lateral extents along the first horizontal direction hd1 that increase with a vertical distance from the logic die 700. The horizontal surfaces within the stepped surfaces of the first three-dimensional memory die 901 can face away from the logic die 700, and the horizontal surfaces within the stepped surfaces of the second three-dimensional memory die 902 can face toward the logic die 700.

In one embodiment, a fourth three-dimensional memory die 904 can be bonded to the first three-dimensional memory die 901, and a three-dimensional memory die 903 can be subsequently bonded to the fourth three-dimensional memory die 904. In one embodiment, the third electrically conductive layers 46 in the third three-dimensional memory die 903 can have different lateral extents along the first horizontal direction hd1 that decrease with a respective vertical distance from the logic die 700, and the fourth electrically conductive layers 46 can have different lateral extents along the first horizontal direction hd1 that increase with a vertical distance from the logic die 700. The horizontal surfaces within the stepped surfaces of the third three-dimensional memory die 903 can face away from the logic die 700, and the horizontal surfaces within the stepped surfaces of the fourth three-dimensional memory die 904 can face toward the logic die 700.

In the second embodiment, the first three-dimensional memory die 901 may be curved or warped with the edges pointing down prior to bonding, while the second three-dimensional memory die 902 may be curved or warped with the edges pointing down up to bonding. After the second three-dimensional memory die 902 is bonded to the first three-dimensional memory die 901 as shown in FIG. 28, the curvature or warp of the bonded dies offset each other, resulting in a more planar bonded assembly.

Figure 29:
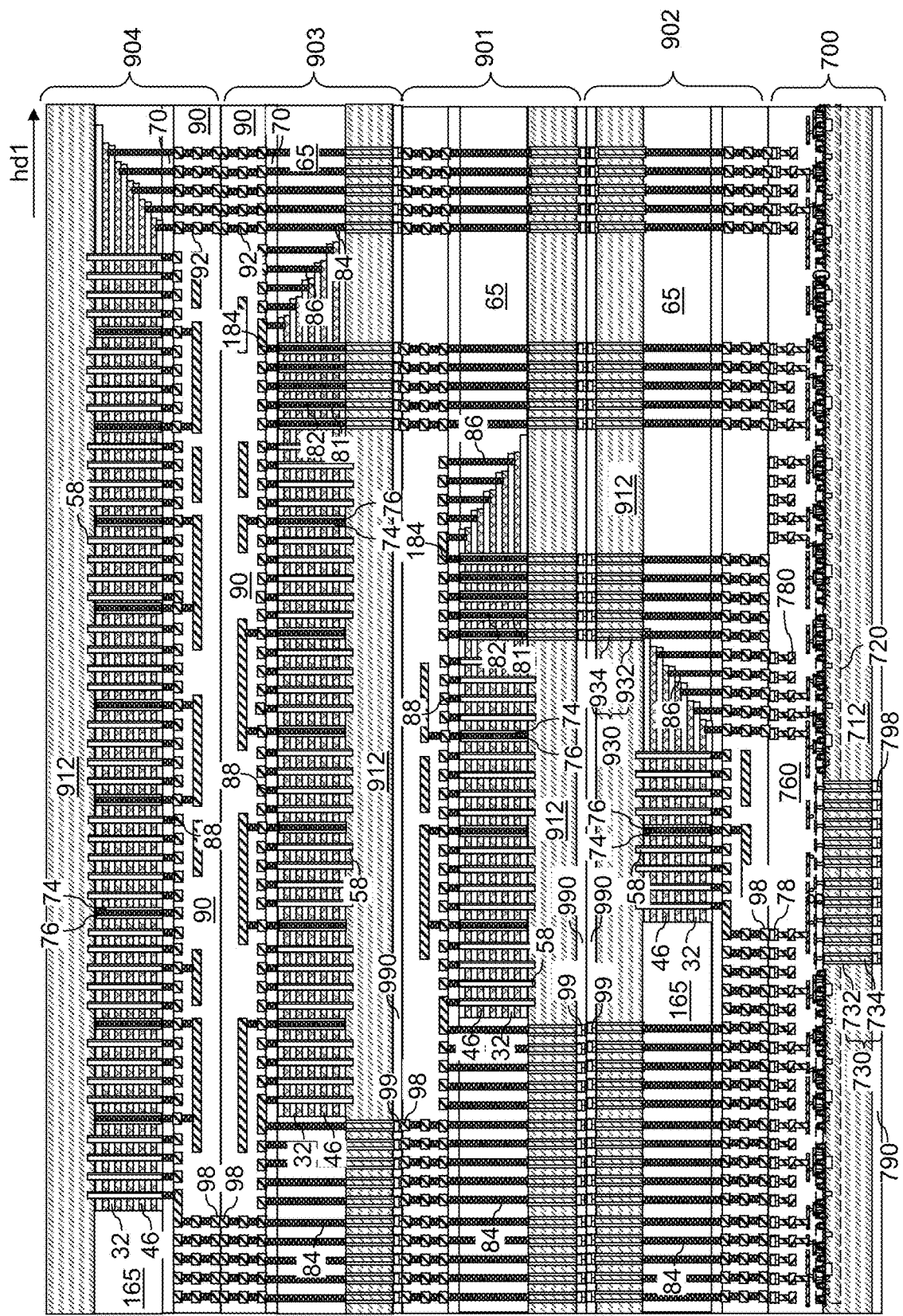
FIG. 29 is a vertical cross-sectional view of an alternative embodiment of the second exemplary structure according to the second embodiment of the present disclosure.

Referring to FIG. 29, an alternative embodiment of the second exemplary structure according to the second embodiment of the present disclosure can be derived from the second exemplary structure of FIG. 29 by attaching a third three-dimensional memory die 903 to the first three-dimensional memory die 901, and by subsequently attaching a fourth three-dimensional memory die 904 to the third three-dimensional memory die 903.

Figure 30:
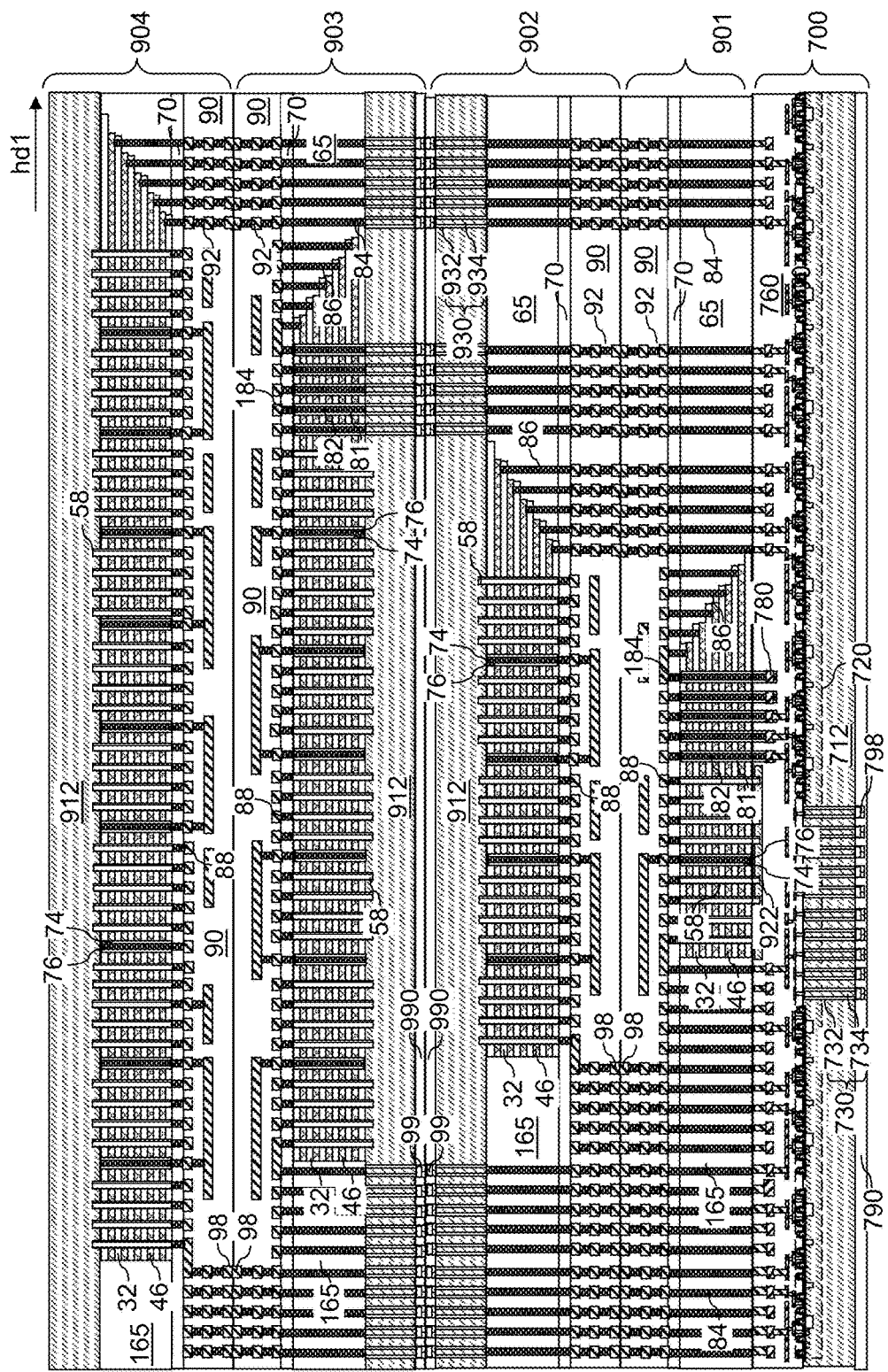
FIG. 30 is vertical cross-sectional view of a third exemplary structure according to a third embodiment of the present disclosure.

Referring to FIG. 30, a third exemplary structure according to a third embodiment of the present disclosure can be derived from the first exemplary structure by depositing the layers of the first three-dimensional memory die 901 over the layers of the logic die 700 in a CMOS under array configuration. In this embodiment, the driver circuit devices, such as CMOS transistors 720 are formed on or move the logic substrate including a logic-die semiconductor material layer 712. Logic-die dielectric material layers 760 are then formed over the driver circuit devices, such as the CMOS transistors 720. A horizontal semiconductor channel layer 922, such as a polysilicon layer, is then deposited over the logic-die dielectric material layers 760. The alternating stack (32, 46) and the memory structures (e.g., memory stack structures 55 of the memory opening fill structures 58) are then deposited over the logic-die dielectric material layers 760. Thus, the first substrate 910 and the bonding pads located between the logic die 700 and the first three-dimensional memory die 901 are omitted and the dies 700 and 901 comprise a monolithic structure and are not bonded to each other in this third embodiment.

In the third embodiment, the monolithic combined logic die 700 and first three-dimensional memory die 901 may be curved or warped with the edges pointing up prior to bonding, while the second three-dimensional memory die 902 may be curved or warped with the edges pointing down prior to bonding. After the second three-dimensional memory die 902 is bonded to the first three-dimensional memory die 901 as shown in FIG. 30, the curvature or warp of the bonded dies offset each other, resulting in a more planar bonded assembly.

While the various embodiments of the present disclosure are illustrated employing embodiments in which four three-dimensional memory dies (901, 902, 903, 904) are attached to a logic die 700, embodiments are expressly contemplated herein in which one, two, three, five, six, seven, or more three-dimensional memory dies are attached to a logic die 700. Furthermore, a portion of the driver circuit devices, such as sense amplifier switching device, may be located in each of the memory dies (901, 902, 903, 904). The sense amplifier switching device in each of the memory dies (901, 902, 903, 904) may be electrically connected to the remaining driver circuit devices, such as the CMOS transistors 720 in the logic die 700 using the laterally-isolated through-stack via structures 82 and/or the respective through-dielectric via structures 84.

Figure 31:
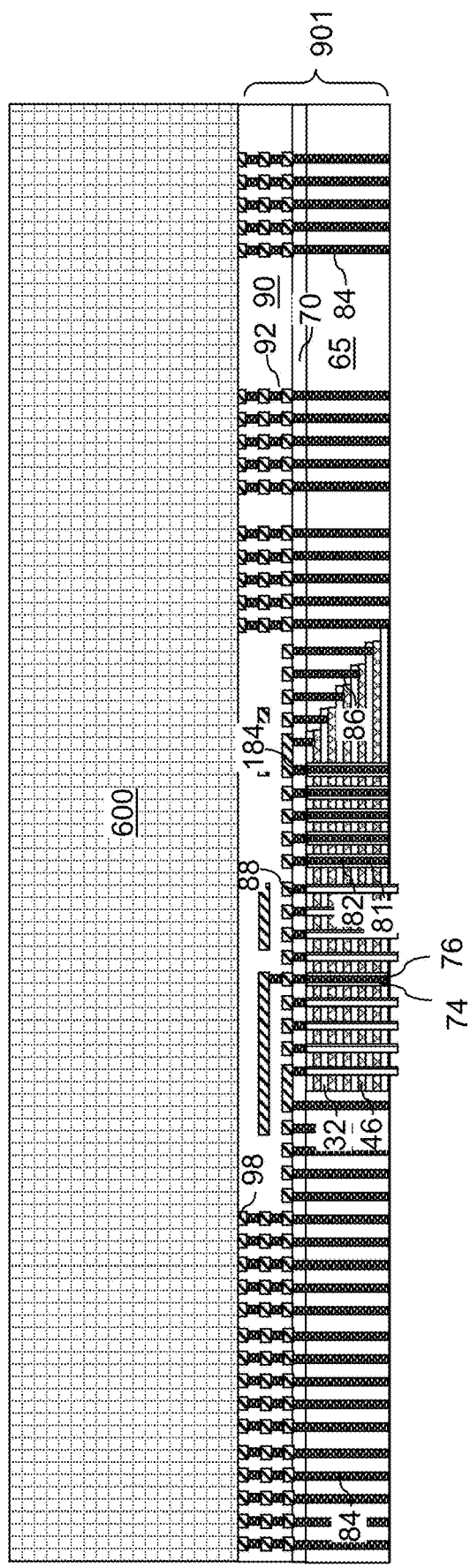
FIGS. 31, 32 and 33 are vertical cross-sectional views of steps in making a fourth exemplary structure according to a fourth embodiment of the present disclosure.

Referring to FIG. 31, a fourth exemplary structure according to a fourth embodiment of the present disclosure can be derived from the first exemplary structure shown in FIG. 17 by omitting formation of the through-substrate connection structures 930 through the semiconductor material layer 912 shown in FIG. 1. Furthermore, the entire substrate 910, including the entire semiconductor material layer 912, is removed in the fourth exemplary structure of FIG. 31 rather than just thinning the substrate 910 to leave a portion of the semiconductor material layer 912 as shown in FIG. 17. After removal of the semiconductor material layer 912, the exposed bottom portions of the memory films 50 are selectively etched to expose bottom portions of the vertical semiconductor channels 60, as described in U.S. Pat. No. 10,629,616 B1 incorporated herein by reference in its entirety.

Figure 32:
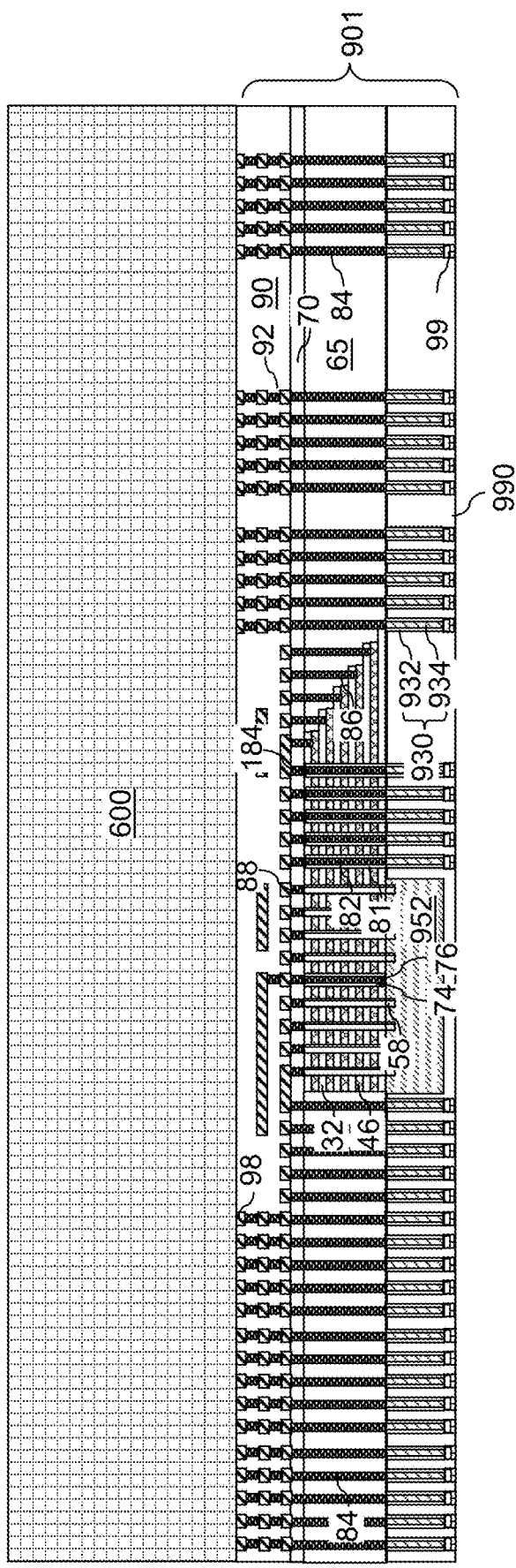

As shown in FIG. 32, a doped semiconductor layer is formed on the exposed portions of the vertical semiconductor channels 60. The doped semiconductor layer may comprise a polycrystalline semiconductor layer, such as polysilicon, having a doping of the opposite conductivity type to the doping of the vertical semiconductor channels 60. The doped semiconductor layer is patterned by photolithography and etching to form a source layer 952 located in the memory array region 100 containing the vertical semiconductor channels 60. The source layer 952 acts as a common source region and/or source line for the vertical NAND strings containing the vertical semiconductor channels 60.

The first backside insulating layer 990 is then formed over the source layer 952 and fills in the exposed spaces that are laterally adjacent to the source layer 952 over the connection regions 200 and the terrace regions 300. Via openings are then formed through the first backside insulating layer 990 by photolithography and etching. The connection structures 930 (which in this embodiment are not "through-substrate" because they extend through an insulating layer rather than through the substrate) and first substrate-side bonding pads 99 are then formed in via openings in the first backside insulating layer 990, as shown in FIG. 32. In this fourth embodiment, the connection structures 930 may include only the respective laterally-isolated via structures 934 (which are not "through-substrate" in this embodiment), while the substrate insulating spacers 932 may be omitted. Alternatively, the insulating spacers 932 (which are not "substrate" insulating spacers in this embodiment) may be present in the connection structures 930.

Figure 33:
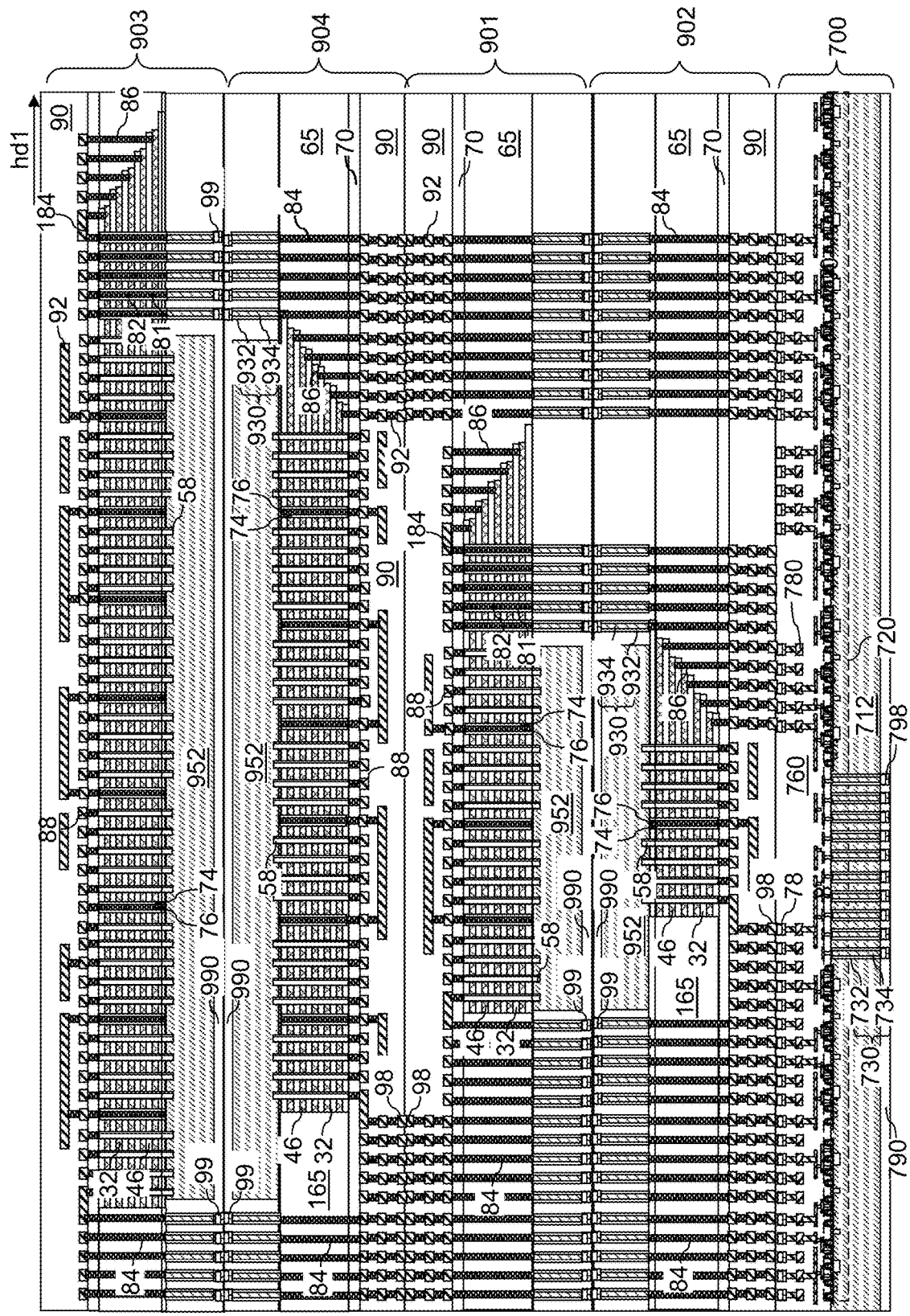

The fourth exemplary structure of FIG. 32 may then be incorporated into any bonded assembly of the first, second or third embodiments. For example, as shown in FIG. 33, the fourth exemplary structure of FIG. 32 is incorporated into the bonded assembly in place of the second exemplary structure of the second embodiment shown in FIG. 28.

Referring to all of the drawings and according to various embodiments of the present disclosure, a bonded assembly includes a first three-dimensional memory die 901 comprising a first alternating stack of first insulating layers 32 and first electrically conductive layers 46, first memory structures 55 located in the first alternating stack, and a first stepped dielectric material portion 65 contacting stepped surfaces of the first alternating stack, a second three-dimensional memory die 902 bonded to the first three-dimensional memory die 901, wherein the second three-dimensional memory die comprises a second alternating stack of second insulating layers 32 and second electrically conductive layers 46, second memory structures 55 located in the second alternating stack, and a second stepped dielectric material portion 65 contacting stepped surfaces of the second alternating stack, and driver circuit devices 720. The first electrically conductive layers 46 have different lateral extents along the first horizontal direction hd1 that decrease with a respective vertical distance from the driver circuit devices 720, and the second electrically conductive layers 46 have different lateral extents along the first horizontal direction hd1 that increase with the respective vertical distance from the driver circuit devices 720.

In one embodiment, the stepped surfaces of the second alternating stack (32, 46) in the first terrace region 300 of the second three-dimensional memory die 902 are laterally offset along the first horizontal direction hd1 from the stepped surfaces of the first alternating stack (32, 46) in the first terrace region 300 of the first three-dimensional memory die 901.

In one embodiment, the first three-dimensional memory die 901 further comprises memory openings 49 vertically extending through each layer within the first alternating stack (32, 46), wherein the first memory structures 55 are located in the memory openings 49 and comprise a respective vertical semiconductor channel 60 and a respective memory film 50. Die 901 also comprises first layer contact via structures 86 vertically extending through the first stepped dielectric material portion 65 and contacting a respective one of the first electrically conductive layers 46, and first laterally-isolated through-stack via structures 82 vertically extending through a region of the first alternating stack (32, 46) in which each layer of the first alternating stack is present and electrically connected to a respective one of the first layer contact via structures 86.

In the first, second and fourth embodiments illustrated in FIGS. 26 to 29 and 33, the bonded assembly further comprises a logic die 700 bonded to the first three-dimensional memory die 901, wherein the driver circuit devices 720 comprise complementary metal oxide semiconductor (CMOS) transistors located in the logic die. In one embodiment, the first three-dimensional memory die 901 further comprises a first substrate 910, wherein the first alternating stack (32,46) is located on a front side of the first substrate 910, first laterally-isolated via structures 934 electrically connected to a respective one of the first laterally-isolated through-stack via structures 82, and first substrate-side bonding pads 99 embedded in a first backside insulating layer 990 located on a backside of the first substrate 910 and electrically connected to a respective one of the first laterally-isolated via structures 934.

In one embodiment, the logic die 700 further comprises logic-die bonding pads 788 embedded in logic-die dielectric material layers 760 and electrically connected to a respective node of the CMOS transistors 720. The first substrate-side bonding pads 99 are bonded to the logic-die bonding pads 788 or are electrically connected to the logic-die bonding pads through electrically conductive paths (98, 934, 84, 92, 99) located within an intervening die located between the logic die and the first three-dimensional memory die.

In another embodiment shown in FIG. 30, the driver circuit devices 720 comprise complementary metal oxide semiconductor (CMOS) transistors located over a logic substrate 712, and the second alternating stack (32, 46) of second insulating layers and second electrically conductive layers is monolithically formed over the driver circuit devices 720 without any bonding pads located between the driver circuit devices and the second alternating stack.

In the first and third embodiments shown in FIGS. 26 and 30, the first three-dimensional memory die 901 is located between the driver circuit devices 720 and the second three-dimensional memory die 902. In the first and third embodiments, the first three-dimensional memory die 901 comprises first dielectric material layers 90 that embed first metal interconnect structures 92 and first interconnect-side bonding pads 98 that are more distal from the driver circuit devices 720 than the first alternating stack (32, 46) is from the driver circuit devices 720, and the second three-dimensional memory die 902 comprises second dielectric material layers 90 that embed second metal interconnect structures 92 and second interconnect-side bonding pads 98 that are more proximal to the driver circuit devices 720 than the second alternating stack (32, 46) is to the driver circuit devices 720.

The first interconnect-side bonding pads 98 are bonded to the second interconnect-side bonding pads 98. The second three-dimensional memory die 902 may further comprise second layer contact via structures 86 vertically extending through the second stepped dielectric material portion 65 and contacting a respective one of the second electrically conductive layers 46. Each of the second layer contact via structures 86 is electrically connected to a respective one of the second interconnect-side bonding pads 98 by a respective subset of the second metal interconnect structures 92.

As shown in FIGS. 26 and 30, a third three-dimensional memory die 903 is bonded to the second three-dimensional die 902. The third three-dimensional memory die 903 comprises a third alternating stack of third insulating layers 32 and third electrically conductive layers 46. The third electrically conductive layers 46 have different lateral extents along the first horizontal direction hd1 that decrease with a respective vertical distance from the driver circuit devices 720, third memory structures 55 located in the third alternating stack, a third stepped dielectric material portion 65 contacting stepped surfaces of the third alternating stack, and third layer contact via structures 86 contacting a respective one of the third electrically conductive layers 46.

In the second embodiment shown in FIG. 28, the second three-dimensional memory die 902 is located between the driver circuit devices 720 and the first three-dimensional memory die 901. A third three-dimensional memory die 904 is bonded to the first three-dimensional die 901. The third three-dimensional memory die 904 comprises a third alternating stack of third insulating layers 32 and third electrically conductive layers 46, wherein the third electrically conductive layers 46 have different lateral extents along the first horizontal direction that increase with a respective vertical distance from the driver circuit devices 720, third memory structures 55 located in the third alternating stack, a third stepped dielectric material portion 65 contacting stepped surfaces of the third alternating stack, and third layer contact via structures 86 contacting a respective one of the third electrically conductive layers 46.

The various embodiments of the present disclosure can provide compact vertical interconnection structures within at least one three-dimensional memory die (901, 902, 903, 904). The compact vertical interconnection structure can include laterally-isolated through-stack via structures 82, through-stack insulating spacers 81, and connection via structures 184 that can be formed in three-dimensional memory dies such as the first three-dimensional memory die 901 and the third three-dimensional memory die 903. Each laterally-isolated through-stack via structures 82 can be formed within a connection region 200 that includes each layer within an alternating stack of insulating layers 32 and electrically conductive layers 46. Each laterally-isolated through-stack via structure 82 can be electrically connected to only one of the electrically conductive layers 46 through a respective one of the layer contact via structures 86, and is electrically isolated from all other electrically conductive layers 46 by a respective through-stack insulating spacer 81. Routing electrical connections through a region of the alternating stack (32, 46) that does not overlap with any of dielectric material portions (65, 165) ensures that the laterally-isolated through-stack via structures 82 do not have any areal overlap with any through-dielectric via structure 84 or with any layer contact via structure 86. The electrically conductive layers 46, which function as word lines for a respective three-dimensional array of memory elements, can be electrically wired to the logic die in a reliable manner employing the laterally-isolated through-stack via structures 82. Furthermore, the memory die that warp in opposite directions may be bonded to each other in such a way as to offset the respective warpage to form a more planar bonded assembly.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a bonded assembly, comprising:
providing a first three-dimensional memory die comprising a first alternating stack of first insulating layers and first electrically conductive layers, first memory structures located in the first alternating stack, and a first stepped dielectric material portion contacting stepped surfaces of the first alternating stack; and
bonding a second three-dimensional memory die to the first three-dimensional memory die, wherein the second three-dimensional memory die comprises a second alternating stack of second insulating layers and second electrically conductive layers, second memory structures located in the second alternating stack, and a second stepped dielectric material portion contacting stepped surfaces of the second alternating stack;
wherein:
the first three-dimensional memory die is located between driver circuit devices and the second three-dimensional memory die;
the first electrically conductive layers have different lateral extents along the first horizontal direction that decrease with a respective vertical distance from the driver circuit devices;
the second electrically conductive layers have different lateral extents along the first horizontal direction that increase with the respective vertical distance from the driver circuit devices; and
each of the second electrically conductive layers has a greater lateral extent than any of the first electrically conductive layers along the first horizontal direction.

2. The method of claim 1, wherein the first three-dimensional memory die further comprises:
memory openings vertically extending through each layer within the first alternating stack, wherein the first memory structures are located in the memory openings and comprise a respective vertical semiconductor channel and a respective memory film;
first layer contact via structures vertically extending through the first stepped dielectric material portion and contacting a respective one of the first electrically conductive layers; and first laterally-isolated through-stack via structures vertically extending through a region of the first alternating stack in which each layer of the first alternating stack is present and electrically connected to a respective one of the first layer contact via structures.

3. The method of claim 1, further comprising bonding a logic die bonded to the first three-dimensional memory die, wherein the driver circuit devices comprise complementary metal oxide semiconductor (CMOS) transistors located in the logic die.

4. The method of claim 1, wherein:
the driver circuit devices comprise complementary metal oxide semiconductor (CMOS) transistors located over a logic substrate; and
the second alternating stack of second insulating layers and second electrically conductive layers is monolithically formed over the driver circuit devices without any bonding pads located between the driver circuit devices and the second alternating stack.

5. The method of claim 1, further comprising bonding a third three-dimensional memory die to the first three-dimensional memory die or to the second three-dimensional memory die,
wherein the third three-dimensional memory die comprises:
a third alternating stack of third insulating layers and third electrically conductive layers,
wherein the third electrically conductive layers have different lateral extents along the first horizontal direction that increase or decrease with a respective vertical distance from the driver circuit devices;
third memory structures located in the third alternating stack;
a third stepped dielectric material portion contacting stepped surfaces of the third alternating stack; and
third layer contact via structures contacting a respective one of the third electrically conductive layers.

6. The method of claim 1, wherein:
the stepped surfaces of the first alternating stack are located in a first terrace region of the first three-dimensional memory die;
the stepped surfaces of the second alternating stack are located in a second terrace region of the second three-dimensional memory die; and
the second terrace region of the second three-dimensional memory die is laterally offset along the first horizontal direction from the first terrace region of the first three-dimensional memory die.

7. A method of forming a bonded assembly, comprising:
providing a first three-dimensional memory die comprising a first backside insulating layer embedding first substrate-side bonding pads, a first semiconductor substrate in direct contact with the first backside insulating layer, a first alternating stack of first insulating layers and first electrically conductive layers, first memory structures located in the first alternating stack, and a first stepped dielectric material portion contacting stepped surfaces of the first alternating stack; and
bonding a second three-dimensional memory die to the first three-dimensional memory die, wherein the second three-dimensional memory die comprises a second alternating stack of second insulating layers and second electrically conductive layers, second memory structures located in the second alternating stack, and a second stepped dielectric material portion contacting stepped surfaces of the second alternating stack;
wherein:
the first three-dimensional memory die is located between driver circuit devices and the second three-dimensional memory die;
the first electrically conductive layers have different lateral extents along the first horizontal direction that decrease with a respective vertical distance from the driver circuit devices; and
the second electrically conductive layers have different lateral extents along the first horizontal direction that increase with the respective vertical distance from the driver circuit devices.

8. The method of claim 7, wherein the first three-dimensional memory die further comprises:
memory openings vertically extending through each layer within the first alternating stack, wherein the first memory structures are located in the memory openings and comprise a respective vertical semiconductor channel and a respective memory film;
first layer contact via structures vertically extending through the first stepped dielectric material portion and contacting a respective one of the first electrically conductive layers; and
first laterally-isolated through-stack via structures vertically extending through a region of the first alternating stack in which each layer of the first alternating stack is present and electrically connected to a respective one of the first layer contact via structures.

9. The method of claim 7, further comprising bonding a logic die bonded to the first three-dimensional memory die, wherein the driver circuit devices comprise complementary metal oxide semiconductor (CMOS) transistors located in the logic die.

10. The method of claim 7, further comprising bonding a third three-dimensional memory die to the first three-dimensional memory die or to the second three-dimensional memory die,
wherein the third three-dimensional memory die comprises:
a third alternating stack of third insulating layers and third electrically conductive layers,
wherein the third electrically conductive layers have different lateral extents along the first horizontal direction that increase or decrease with a respective vertical distance from the driver circuit devices;
third memory structures located in the third alternating stack;
a third stepped dielectric material portion contacting stepped surfaces of the third alternating stack; and
third layer contact via structures contacting a respective one of the third electrically conductive layers.

11. The method of claim 7, wherein each of the second electrically conductive layers has a greater lateral extent than any of the first electrically conductive layers along the first horizontal direction.

12. The method of claim 11, wherein:
the stepped surfaces of the first alternating stack are located in a first terrace region of the first three-dimensional memory die;
the stepped surfaces of the second alternating stack are located in a second terrace region of the second three-dimensional memory die; and
the second terrace region of the second three-dimensional memory die is laterally offset along the first horizontal direction from the first terrace region of the first three-dimensional memory die.

13. A method of forming a bonded assembly, comprising:
providing a first three-dimensional memory die comprising a first alternating stack of first insulating layers and first electrically conductive layers, first memory structures located in the first alternating stack, and a first stepped dielectric material portion contacting stepped surfaces of the first alternating stack; and
bonding a second three-dimensional memory die to the first three-dimensional memory die, wherein the second three-dimensional memory die comprises a second alternating stack of second insulating layers and second electrically conductive layers, second memory structures located in the second alternating stack, and a second stepped dielectric material portion contacting stepped surfaces of the second alternating stack;
wherein:
the first three-dimensional memory die is located between driver circuit devices and the second three-dimensional memory die;
the first electrically conductive layers have different lateral extents along the first horizontal direction that vary with a respective vertical distance from the driver circuit devices;
the second electrically conductive layers have different lateral extents along the first horizontal direction that vary with the respective vertical distance from the driver circuit devices in an opposite direction from the first electrically conductive layers;
the stepped surfaces of the first alternating stack are located in a first terrace region of the first three-dimensional memory die;
the stepped surfaces of the second alternating stack are located in a second terrace region of the second three-dimensional memory die; and
the second terrace region of the second three-dimensional memory die is laterally offset along the first horizontal direction from the first terrace region of the first three-dimensional memory die.

14. The method of claim 13, wherein the first three-dimensional memory die further comprises memory openings vertically extending through each layer within the first alternating stack, wherein the first memory structures are located in the memory openings and comprise a respective vertical semiconductor channel and a respective memory film.

15. The method of claim 14, wherein the first three-dimensional memory die further comprises:
first layer contact via structures vertically extending through the first stepped dielectric material portion and contacting a respective one of the first electrically conductive layers; and
first laterally-isolated through-stack via structures vertically extending through a region of the first alternating stack in which each layer of the first alternating stack is present and electrically connected to a respective one of the first layer contact via structures.

16. The method of claim 13, further comprising bonding a logic die bonded to the first three-dimensional memory die, wherein the driver circuit devices comprise complementary metal oxide semiconductor (CMOS) transistors located in the logic die.

17. The method of claim 13, further comprising bonding a third three-dimensional memory die to the first three-dimensional memory die or to the second three-dimensional memory die.

18. The method of claim 17, wherein the third three-dimensional memory die comprises:
a third alternating stack of third insulating layers and third electrically conductive layers, wherein the third electrically conductive layers have different lateral extents along the first horizontal direction that increase or decrease with a respective vertical distance from the driver circuit devices;
third memory structures located in the third alternating stack;
a third stepped dielectric material portion contacting stepped surfaces of the third alternating stack; and
third layer contact via structures contacting a respective one of the third electrically conductive layers.

19. The method of claim 13, wherein each of the second electrically conductive layers has a greater lateral extent than any of the first electrically conductive layers along the first horizontal direction.

* * * * *